(12) United States Patent
Maeda et al.

(10) Patent No.: US 10,896,825 B2
(45) Date of Patent: *Jan. 19, 2021

(54) MOLD

(71) Applicant: TOSHIBA MEMORY CORPORATION, Minato-ku (JP)

(72) Inventors: Takeori Maeda, Mie (JP); Ryoji Matsushima, Yokkaichi (JP); Makoto Minaminaka, Suzuka (JP); Naoki Iwamasa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 161 days.

This patent is subject to a terminal disclaimer.

(21) Appl. No.: 15/704,103

(22) Filed: Sep. 14, 2017

(65) Prior Publication Data

US 2018/0254198 A1 Sep. 6, 2018

(30) Foreign Application Priority Data

Mar. 3, 2017 (JP) .................................. 2017-040474

(51) Int. Cl.
*H01L 21/56* (2006.01)
*H01L 21/67* (2006.01)
(Continued)

(52) U.S. Cl.
CPC ............ *H01L 21/565* (2013.01); *B29C 45/34* (2013.01); *H01L 21/67126* (2013.01); *B29C 45/14655* (2013.01); *H01L 2924/181* (2013.01)

(58) Field of Classification Search
CPC ............. H01L 21/565; H01L 21/67126; H01L 2924/181; B29C 45/34; B29C 45/14655
(Continued)

(56) References Cited

U.S. PATENT DOCUMENTS 5,397,230 A 3/1995 Brew
5,753,538 A * 5/1998 Kuno ............... B29C 45/14655
249/65

(Continued)

FOREIGN PATENT DOCUMENTS

CN 1638071 A 7/2005
CN 1946536 A 4/2007
(Continued)

OTHER PUBLICATIONS

U.S. Appl. No. 15/414,165, filed Jan. 24, 2017, Takeori Maeda, et al.
(Continued)

*Primary Examiner* — Robert C Dye
*Assistant Examiner* — Guy F Mongelli
(74) *Attorney, Agent, or Firm* — Oblon, McClelland, Maier & Neustadt, L.L.P.

(57) ABSTRACT

A mold according to an embodiment includes a first surface to be in contact with a surface of a substrate to be processed. A cavity portion recedes in a first direction being away from the first surface. A vent portion recedes in the first direction and is closer to the first surface than the cavity portion. The vent portion communicates with the cavity portion and serves as a discharge path for gas in the cavity portion. A suction portion recedes in the first direction and is farther from the first surface than the vent portion. The suction portion communicates with the vent portion. A first opening/closing portion is provided between the vent portion and the suction portion, and opens and closes or narrows down the discharge path. A second opening/closing portion is provided between the first opening/closing portion and the suction portion, and opens and closes the discharge path.

8 Claims, 14 Drawing Sheets

(51) Int. Cl.
*B29C 45/34* (2006.01)
*B29C 45/14* (2006.01)

(58) Field of Classification Search
USPC .................................................. 264/272.17
See application file for complete search history.

(56) References Cited

U.S. PATENT DOCUMENTS

| | | | |
|---|---|---|---|
| 6,676,885 B2 | 1/2004 | Shimizu et al. | |
| 7,371,606 B2 | 5/2008 | Ujiie et al. | |
| 7,481,642 B2 | 1/2009 | Niewels | |
| 2005/0133895 A1* | 6/2005 | Ujiie | H01L 21/561 257/678 |
| 2005/0186711 A1* | 8/2005 | Yee | B29C 45/14418 438/123 |
| 2010/0327203 A1* | 12/2010 | Nagai | F16K 3/06 251/193 |
| 2012/0135096 A1* | 5/2012 | Maeyama | B29C 31/008 425/130 |
| 2013/0230618 A1* | 9/2013 | Lee | B29C 45/26 425/588 |
| 2015/0243532 A1* | 8/2015 | Baba | B29C 45/14262 264/40.3 |
| 2016/0240396 A1 | 8/2016 | Cheon | |
| 2017/0263476 A1 | 9/2017 | Maeda et al. | |
| 2017/0271186 A1 | 9/2017 | Maeda et al. | |

FOREIGN PATENT DOCUMENTS

| | | |
|---|---|---|
| JP | 10-256287 A | 9/1998 |
| JP | 3510554 B2 | 1/2004 |
| JP | 2007-533493 | 11/2007 |
| JP | 2010-165938 A | 7/2010 |
| JP | 2012-192532 A | 10/2012 |
| JP | 2014-172287 A | 9/2014 |
| JP | 2014-218038 A | 11/2014 |
| JP | 2015-520 A | 1/2015 |
| JP | 2017-159630 | 9/2017 |
| TW | 201436127 A | 9/2014 |

OTHER PUBLICATIONS

U.S. Appl. No. 15/455,475, filed Mar. 10, 2017, Takeori Maeda, et al.

* cited by examiner

MOLD

CROSS REFERENCE TO RELATED APPLICATIONS

This application is based upon and claims the benefit of priority from the prior Japanese Patent Application No. 2017-040474, filed on Mar. 3, 2017, the entire contents of which are incorporated herein by reference.

FIELD

The embodiments of the present invention relate to a mold.

BACKGROUND

A gap into which resin is poured when a semiconductor device is sealed by the resin is narrowed because of downscaling of the semiconductor devices, increase of layers to be laminated in the semiconductor devices, and the like. In order to handle this narrowing of the gap, viscosity of resin is lowered. However, when the viscosity of resin is lowered, the resin passes through a cavity of a mold and reaches an exhaust hole in a short time. Therefore, when exhausting of air in the cavity of the mold is continued until immediately before completion of filling of the resin, the resin leaks through the exhaust hole.

Further, when the viscosity of resin is lowered, the resin flows within the cavity while including voids (air). In order to eliminate the voids, it is preferable to reduce the pressure in the cavity and to degas the cavity until immediately before completion of filling of the resin. However, also in this case, the resin can easily leak through the exhaust hole.

DETAILED DESCRIPTION

Figure 1:
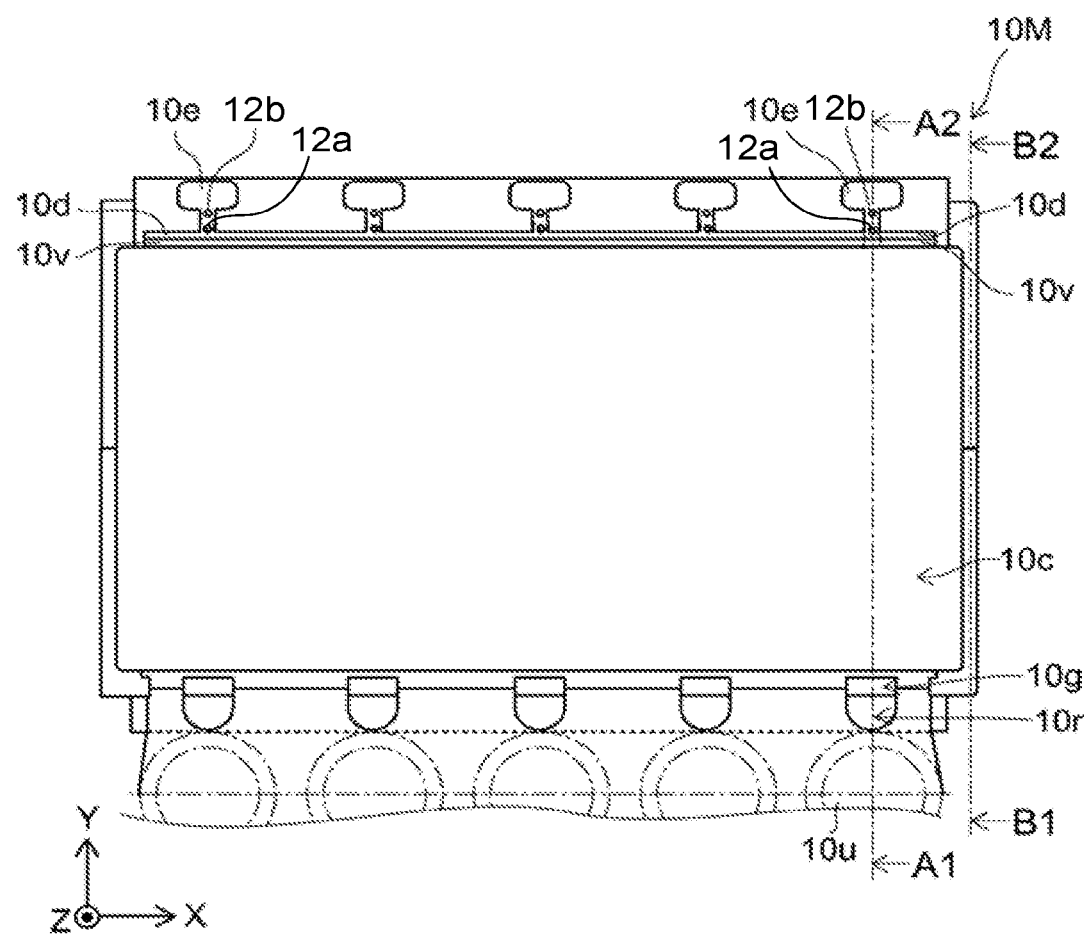
FIG. 1 is a plan view illustrating an example of a mold according to a first embodiment.

A mold according to an embodiment includes a first surface to be in contact with a surface of a substrate to be processed. A cavity portion recedes in a first direction being away from the first surface. A vent portion recedes in the first direction and is closer to the first surface than the cavity portion. The vent portion communicates with the cavity portion and serves as a discharge path for gas in the cavity portion. A suction portion recedes in the first direction and is farther from the first surface than the vent portion. The suction portion communicates with the vent portion. A first opening/closing portion is provided between the vent portion and the suction portion, and opens and closes or narrows down the discharge path. A second opening/closing portion is provided between the first opening/closing portion and the suction portion, and opens and closes the discharge path.

Embodiments will now be explained with reference to the accompanying drawings. The present invention is not limited to the embodiments. The drawings are schematic or conceptual, and relations between the thickness and width of respective parts and size ratios between the parts are not necessarily identical to actual products. There are cases where respective sizes and ratios are expressed differently depending on the drawings, even in a case of illustrating the same part. In the present specification and the drawings, elements identical to those described with regard to the drawings already explained are denoted by like reference characters, and detailed descriptions thereof are omitted as appropriate.

First Embodiment

Figure 2A:
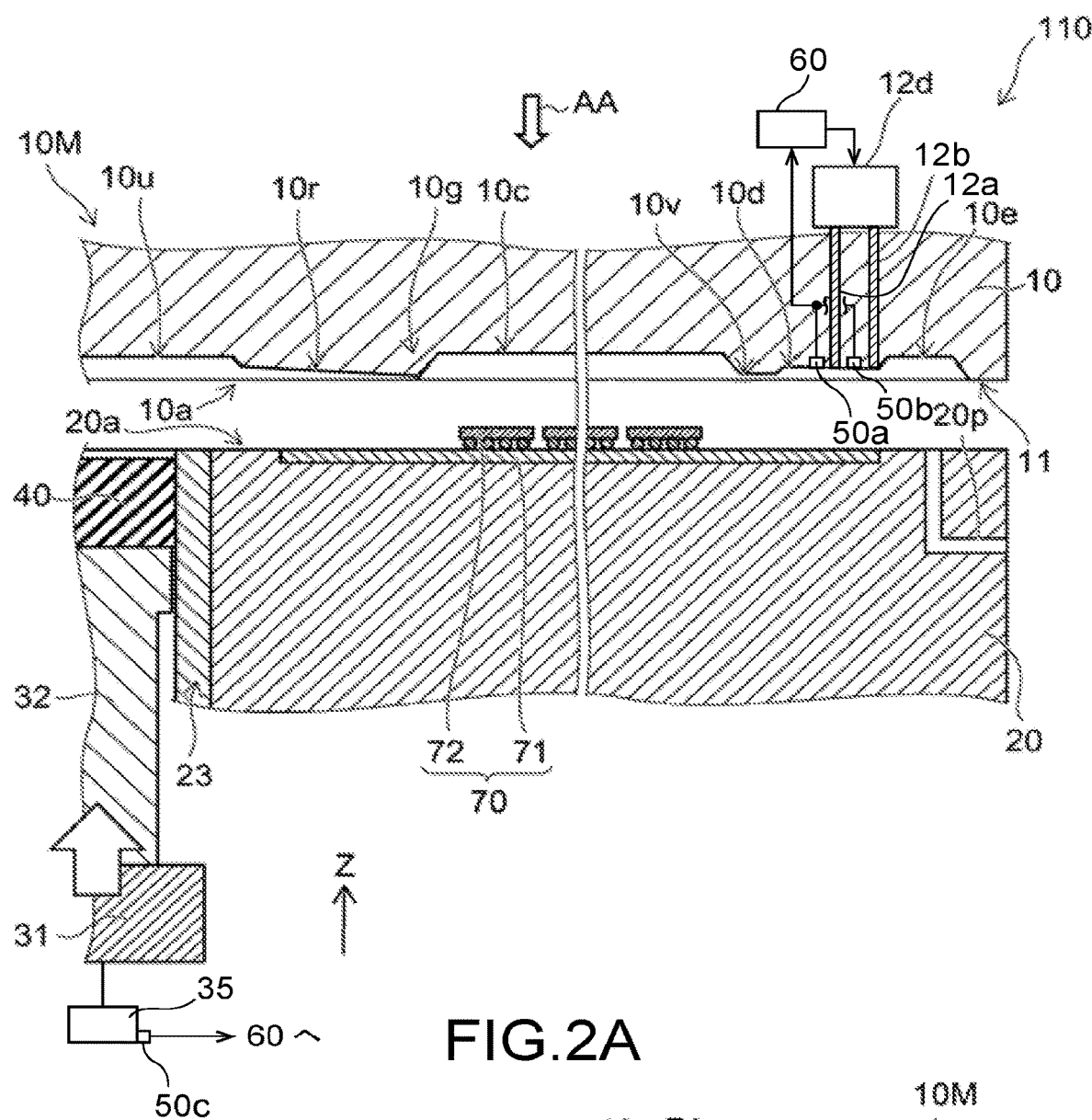
FIGS. 2A and 2B are cross-sectional views illustrating an example of the mold and a transfer molding device according to the first embodiment.
Figure 2B:
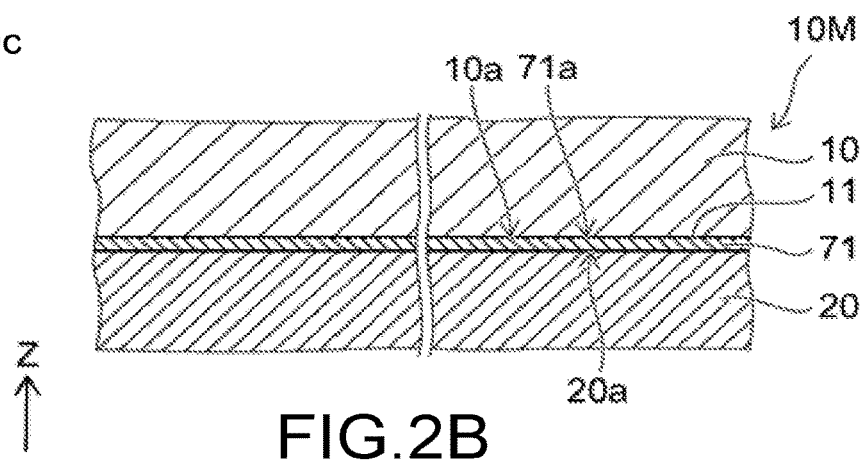

FIG. 1 is a plan view illustrating an example of a mold according to a first embodiment. FIGS. 2A and 2B are cross-sectional views illustrating an example of the mold and a transfer molding device according to the first embodiment. FIG. 1 is a plan view when the mold is seen from a direction indicated by an arrow AA in FIG. 2A. FIG. 2A is a cross-sectional view, taken along a line A1-A2 in FIG. 1. FIG. 2B is a cross-sectional view, taken along a line B1-B2 in FIG. 1.

As illustrated in FIG. 2A, a mold 10M according to the first embodiment includes a first mold 10 and a second mold 20. A main surface 10a of the first mold 10 is arranged to be opposed to a main surface 20a of the second mold 20. FIG. 2A illustrates an example of a state in which the two molds are away from each other. It is assumed that a direction from the second mold 20 to the first mold 10 is a Z-axis direction as a first direction. One of directions perpendicular to the Z-axis direction is assumed to be an X-axis direction. A direction perpendicular to the Z-axis direction and the X-axis direction is assumed to be a Y-axis direction.

A substrate to be processed 71 of an object to be processed 70 is arranged on the main surface 20a of the second mold 20. A semiconductor chip 72 is provided on the substrate to be processed 71, for example. The substrate to be processed 71 and the semiconductor chip 72 are packaged by a resin material to form a semiconductor device. The position of the first mold 10 and the position of the second mold 20 may be switched with each other. For example, the substrate to be processed 71 may be arranged on the first mold 10 and the second mold 20 may be arranged above the first mold 10.

FIG. 2B illustrates a state in which the two molds are closed. The first mold 10 has a substrate clamping surface 11 (a surface of a substrate clamping portion) as a first surface. As illustrated in FIG. 2B, the substrate to be processed 71 is arranged between the two molds 10 and 20. In a state in which the two molds 10 and 20 are closed, the substrate clamping surface 11 is in contact with the substrate to be processed 71, for example.

As illustrated in FIG. 2A, the object to be processed 70 is arranged between the first mold 10 and the second mold 20, and the first mold 10 is moved down or the second mold 20 is moved up, so that the first mold 10 and the second mold 20 are closed. In this manner, the object to be processed 70 is arranged in a cavity portion 10c between the first mold 10 and the second mold 20. At this time, the substrate clamping surface 11 is in contact with a surface 71a of the substrate to be processed 71, as illustrated in FIG. 2B. The substrate to be processed 71 is clamped by the substrate clamping surface 11 and a surface (the main surface 20a) of the second mold 20.

As illustrated in FIG. 2A, the main surface 10a of the first mold 10 is provided with concave portions. The cavity portion 10c and the like are formed by the concave portions, when the first mold 10 and the second mold 20 are closed. When a resin material 40 is introduced into the cavity portion 10c, the resin material 40 seals the semiconductor chip 72 in the cavity portion 10c and is molded in accordance with the shape of the cavity portion 10c.

Figure 3:
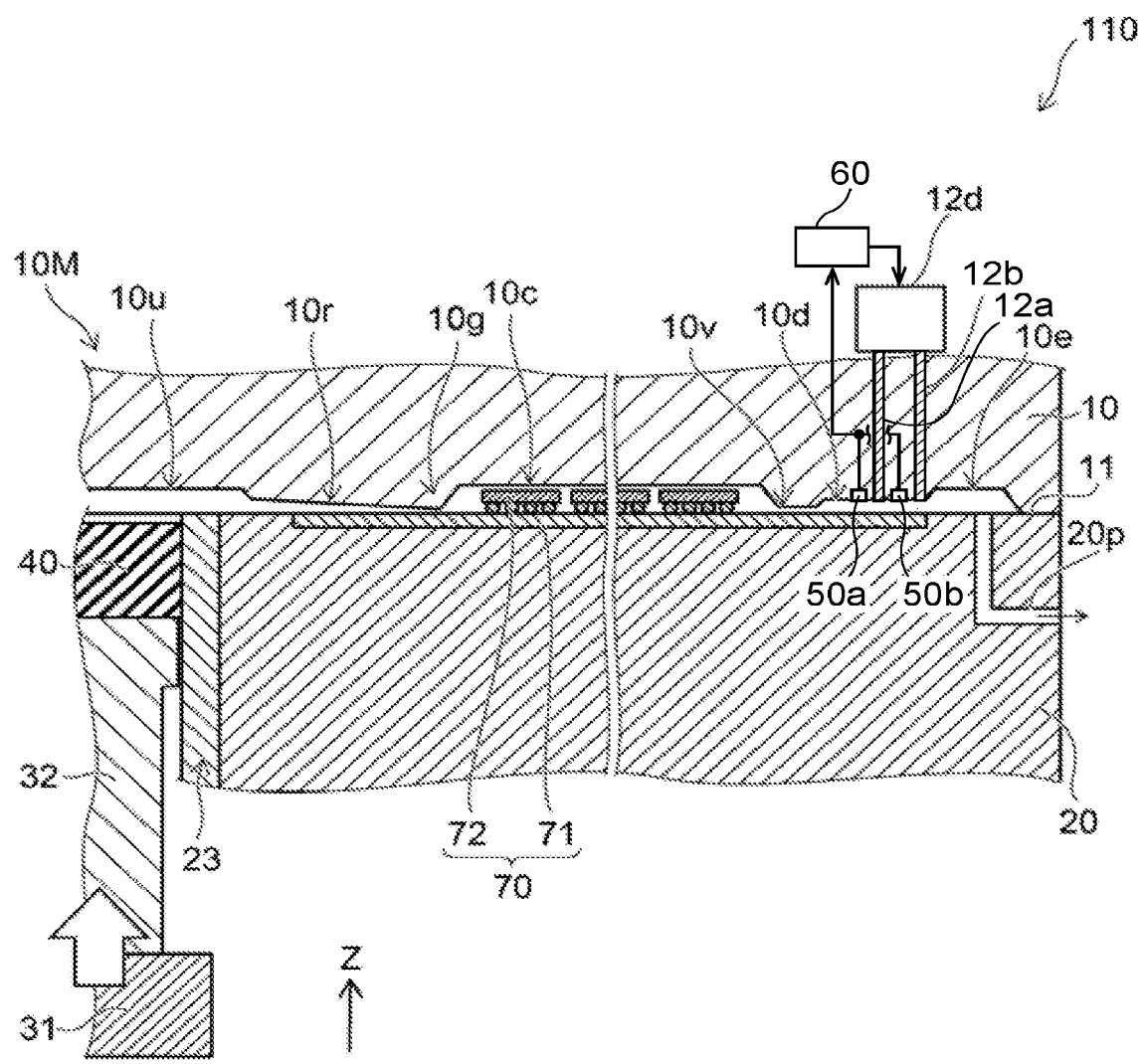
FIG. 3 is a cross-sectional view illustrating a state in which the mold and the transfer molding device according to the first embodiment are closed.

The main surface 10a of the first mold 10 is provided with a cull portion 10u, a runner portion 10r, a gate portion 10g, the cavity portion 10c, a vent portion 10v, an intermediate cavity (dummy cavity) portion 10d, and a suction portion 10e, as the concave portions. Each of these concave portions is a region that recedes from a flat portion (the substrate clamping surface 11) of the main surface 10a of the first mold 10. These concave portions communicate with each other in such a manner that the resin material 40 and gas can pass therethrough, as illustrated in FIG. 3, when the first mold 10 and the second mold 20 are closed. FIG. 3 is a cross-sectional view illustrating a state in which the mold and the transfer molding device according to the first embodiment are closed.

The cull portion 10u recedes to be relatively far (deep) from the substrate clamping surface 11, as an introducing portion for the resin material 40. The runner portion 10r is formed to be closer to the substrate clamping surface 11 (to become shallower) as approaching from the cull portion 10u to the gate portion 10g. That is, the runner portion 10r is formed in such a manner that a path for the resin material 40 becomes narrower as the runner portion 10r approaches from the cull portion 10u to the gate portion 10g. The gate portion 10g recedes from the substrate clamping surface 11 shallowly, and is also narrow in a width direction, as illustrated in FIG. 1. This configuration allows easy separation of the resin material 40 filled in the cavity portion 10c.

The cavity portion 10c recedes from the substrate clamping surface 11 in the Z-direction to enable the semiconductor chip 72 to be accommodated between the cavity portion 10c and the mold 20. The semiconductor chip 72 in the cavity portion 10c is sealed by the resin material 40, and is thereafter separated as a product.

The vent portion 10v recedes from the substrate clamping surface 11 in the Z-direction. The vent portion 10v is closer to the substrate clamping surface 11 and is shallower than the cavity portion 10c. The vent portion 10v communicates with the cavity portion 10c to serve as a discharge path for gas in the cavity portion 10c, when the first mold 10 and the second mold 20 are closed. The intermediate cavity portion 10d is located between the vent portion 10v and the suction portion 10e, and recedes to be farther (deeper) from the substrate clamping surface 11 than the vent portion 10v. The intermediate cavity portion 10d extends from a region that is approximately as wide as the cavity portion 10c in width in the X-direction to a narrower discharge path, as illustrated in FIG. 1. The suction portion 10e recedes from the substrate clamping surface 11 in the Z-direction and is farther (deeper) from the substrate clamping surface 11 than the vent portion 10v.

As illustrated in FIG. 3, the path for the resin material 40 and the discharge path for gas lead from the cull portion 10u to the suction portion 10e, when the first mold 10 and the second mold 20 are closed. Therefore, in introduction of the resin material 40 into the cavity portion 10c, the resin material 40 is introduced from the cull portion 10u, while gas in the cavity portion 10c is exhausted from the suction portion 10e. In this manner, the resin material 40 is introduced and filled into the cavity portion 10c smoothly.

The first mold 10 is provided with a first opening/closing portion 12a and a second opening/closing portion 12b. The first and second opening/closing portions 12a and 12b are shut-off pins, for example. The first opening/closing portion 12a is provided in the intermediate cavity portion 10d between the vent portion 10v and the suction portion 10e, and opens and closes a discharge path for air in the cavity portion 10c. The second opening/closing portion 12b is provided between the first opening/closing portion 12a and the suction portion 10e, and opens and closes the above discharge path. As illustrated in FIG. 1, the first and second opening/closing portions 12a and 12b are provided in a narrower discharge path of the intermediate cavity portion 10d, so as to suppress entry of the resin material 40 to the suction portion 10e side. In this manner, the first and second opening/closing portions 12a and 12b can suppress the resin material 40 from flowing to the suction portion 10e or a suction path 20p without hindering exhausting of air inside the cavity portion 10c.

The first and second opening/closing portions 12a and 12b are each brought into a closed state by moving in an opposite direction to the Z-direction, and into an opened state by returning in the Z-direction. The opened state of each of the first and second opening/closing portions 12a and 12b is a state in which the discharge path is opened to allow gas to be exhausted. In FIG. 2A, the first and second opening/closing portions 12a and 12b are in opened states. Meanwhile, the closed state of each of the first and second opening/closing portions 12a and 12b is a state in which the opening/closing portion 12a or 12b cuts off or narrows down the discharge path in such a manner that passage of gas or the resin is suppressed or hindered. The closed state of the first opening/closing portion 12a includes not only a state in which the discharge path is cut off in an airtight or liquid-tight manner but also a state in which the discharge path is narrowed down than in the opened state. That is, even when the first opening/closing portion 12a is brought into a closed state, the discharge path may include a gap (see G in FIG. 5).

The mold 10M or the main body of a molding device 110 is provided with a driver 12d that causes the first and second opening/closing portions 12a and 12b to operate. The driver 12d moves the first and second opening/closing portions 12a and 12b in the Z-direction or an opposite direction thereto to bring each of the first and second opening/closing portions 12a and 12b into an opened state or a closed state. The driver 12d can control the first and second opening/closing portions 12a and 12b independently of each other to cause the respective portions to operate at mutually different timings. The driver 12d is not particularly limited, but may be a motor or an air actuator (an air cylinder) that moves the first and second opening/closing portions 12a and 12b pneumatically, for example, as will be described later in a fifth embodiment. In a case where the driver 12d is a motor, the driver 12d is arranged outside the mold 10M, considering heat of the mold 10M. In a case where the driver 12d is an air actuator, the driver 12d may be arranged inside the mold 10M because the air actuator is high in heat resisting property.

The first mold 10 is provided with sensors 50a and 50b arranged in the vicinity of the first and second opening/closing portions 12a and 12b. The sensors 50a and 50b are provided at an end of an air-exhausting side of the cavity portion 10c, in the vent portion 10v, or in the intermediate cavity portion 10d of the first mold 10, for example.

A controller 60 controls the driver 12d based on detection signals from the sensors 50a and 50b to cause the driver 12d to drive the first and second opening/closing portions 12a and 12b. Also, the controller 60 controls discharge of gas from a space inside the mold 10M, or controls introduction of the resin material 40 that is performed based on an operation of a transfer portion 31, for example. The controller 60 may be provided in the mold 10M or in the main body of the molding device 110.

(Operation Timings of First and Second Opening/Closing Portions 12a and 12b)

Assuming that a source of the resin material 40 or gas is an upstream side and a destination thereof is a downstream side, the sensor 50a is arranged on the upstream side of the first opening/closing portion 12a between the vent portion 10v and the first opening/closing portion 12a in the first embodiment. The sensor 50b is arranged on the upstream side of the second opening/closing portion 12b between the first opening/closing portion 12a and the second opening/closing portion 12b. Each of the sensors 50a and 50b may be a temperature sensor that detects the temperature of the first mold 10, a pressure sensor that detects the pressure of the resin material 40 or gas, or a photosensor that detects at least one of the intensity of reflected light and the intensity of transmitted light. That is, a parameter detected by each of the sensors 50a and 50b may be any of the temperature of the mold 10, the pressure of the resin material 40, the pressure of gas, the intensity of reflected light, and the intensity of transmitted light. The sensors 50a and 50b may be the same type of sensors or different types of sensors from each other.

The sensors 50a and 50b each detect the resin material 40. For example, in a case where the sensors 50a and 50b are temperature sensors, the temperature of the surroundings of each of the sensors 50a and 50b or the temperature of each of the sensors 50a and 50b itself increases when the resin material 40 comes closer to or comes into contact with the sensor 50a or 50b. When a measured temperature exceeds a threshold, each of the sensors 50a and 50b outputs a detection signal indicating arrival of the resin material 40, to the controller 60. The controller 60 controls the driver 12d in accordance with the detection signal. In this manner, the driver 12d can bring each of the first and second opening/closing portions 12a and 12b into a closed state.

For example, in a case where the sensors 50a and 50b are pressure sensors, each of the sensors 50a and 50b detects increase of the pressure of the resin material 40 or gas when the resin material 40 comes closer to or comes into contact with the sensor 50a or 50b. When the pressure exceeds a threshold, each of the sensors 50a and 50b outputs a detection signal indicating arrival of the resin material 40, to the controller 60.

For example, in a case where the sensors 50a and 50b are photosensors, each of the sensors 50a and 50b detects the resin material 40 by using a change of the intensity of reflected light or a change of the intensity of transmitted light when the resin material 40 passes directly below the sensor 50a or 50b. When the intensity of reflected light or the intensity of transmitted light exceeds or falls below a threshold, each of the sensors 50a and 50b outputs a detection signal indicating arrival of the resin material 40, to the controller 60.

Further, a sensor 50c may be provided in a motor 35 that drives a plunger 32. The sensor 50c can be an encoder that detects the position of the plunger 32 from the rotational position of the motor 35, for example. The volume of the resin material 40 fed into the cavity portion 10c can be found from a moving distance of the plunger 32. Therefore, it is possible to determine that the resin material 40 has arrived at a position in the vicinity of the vent portion 10v when the position of the plunger 32 arrives at a predetermined position. Accordingly, the sensor 50c outputs a detection signal indicating arrival of the resin material 40, to the controller 60 when the position of the plunger 32 arrives at the predetermined position. In this case, a parameter detected by the sensor 50c is the position of the plunger 32 or the amount (volume) of the resin material 40. Further, the sensor 50c is not arranged in the mold 10M, but is arranged in the main body of the molding device 110 in this case.

The detection signals from the respective sensors 50a, 50b, and 50c serve as triggers that cause the first and second opening/closing portions 12a and 12b to operate, as described above. Therefore, the positions of the respective sensors 50a, 50b, and 50c, and the thresholds of the parameters have to be appropriately adjusted in such a manner that the first and second opening/closing portions 12a and 12b operate at appropriate timings.

It suffices that at least any one of the sensors 50a, 50b, and 50c is provided. For example, in a case where only any one of the sensors 50a to 50c is provided, it suffices that the controller 60 brings the first opening/closing portion 12a into a closed state when that sensor outputs a detection signal, and thereafter brings the second opening/closing portion 12b into a closed state after a predetermined time passes. That is, the first opening/closing portion 12a is controlled by the detection signal from the sensor, and the second opening/closing portion 12b is controlled by the detection signal from the sensor and time. In this case, a parameter that causes the second opening/closing portion 12b to operate is a time from reception of the detection signal by the controller 60.

For example, in a case where any two of the sensors 50a to 50c are provided, it suffices that the controller 60 brings the first opening/closing portion 12a into a closed state when one of the sensors outputs a detection signal, and thereafter brings the second opening/closing portion 12b into a closed state when the other sensor outputs a detection signal. Alternatively, the controller 60 may bring the first opening/closing portion 12a into a closed state when the two sensors output detection signals, and thereafter bring the second opening/closing portion 12b into a closed state after a predetermined time passes.

For example, in a case where all the sensors 50a to 50c are provided, it suffices that the controller 60 brings the first opening/closing portion 12a into a closed state when two of the sensors output detection signals, and thereafter brings the second opening/closing portion 12b into a closed state when the remaining one sensor outputs a detection signal. Alternatively, it suffices that the controller 60 brings the first opening/closing portion 12a into a closed state when one of the sensors outputs a detection signal, and thereafter brings the second opening/closing portion 12b into a closed state when the remaining two sensors output detection signals. Further, the controller 60 may bring the first opening/closing portion 12a into a closed state when all the three sensors output detection signals, and thereafter bring the second opening/closing portion 12b into a closed state after a predetermined time passes.

In this manner, the sensors 50a to 50c can be used for controlling the first and second opening/closing portions 12a and 12b in various combinations.

(Operation of Molding Device 110)

Next, an operation of the molding device 110 according to the first embodiment is described.

Figure 4:
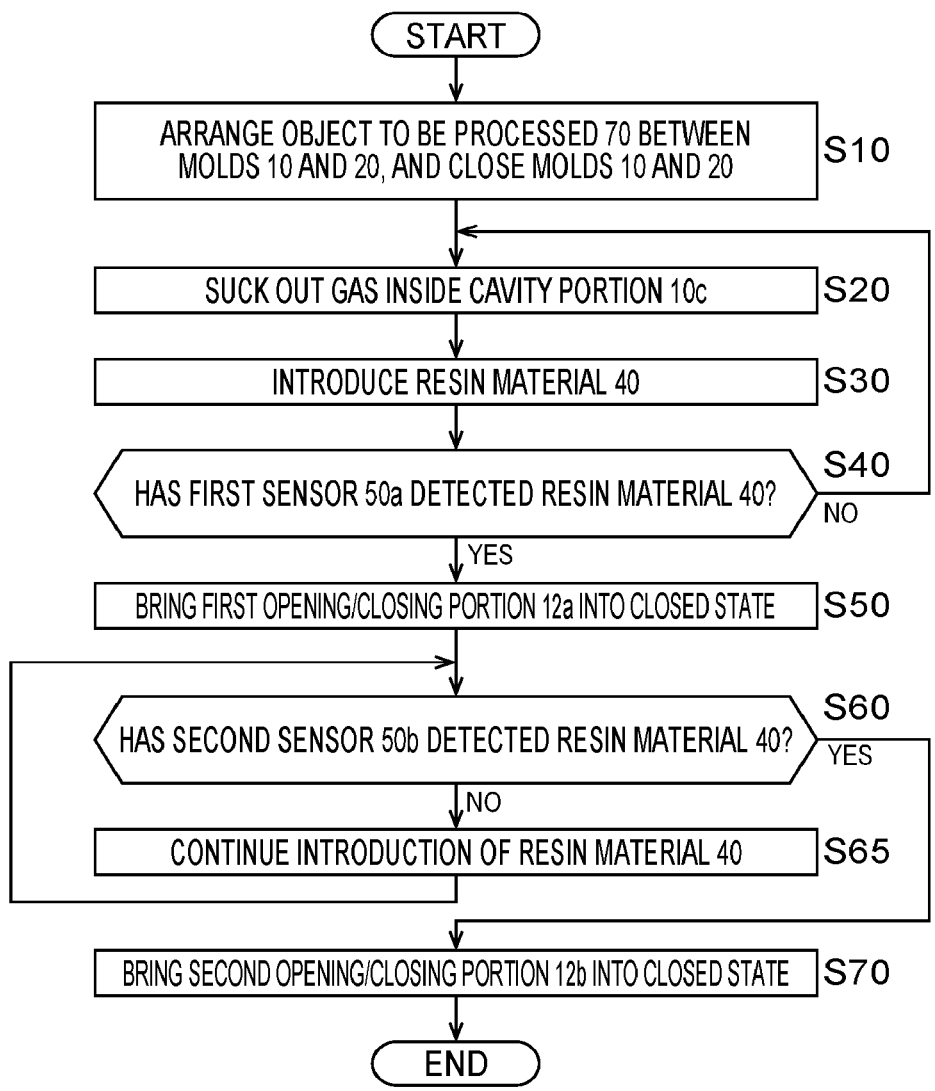
FIG. 4 is a flowchart illustrating an operation example of a molding device according to the first embodiment.

FIG. 4 is a flowchart illustrating an operation example of the molding device 110 according to the first embodiment. It is assumed that the sensors 50a and 50b are used in the first embodiment.

First, the object to be processed 70 is arranged between the two molds 10 and 20, and the molds 10 and 20 are brought closer to each other and are closed (Step S10). At this time, the first and second opening/closing portions 12a and 12b are in opened states. Therefore, gas inside the cavity portion 10c (for example, air or gas coming out from the resin material 40) is discharged through a discharge path formed by the vent portion 10v, the intermediate cavity portion 10d, the suction portion 10e, and the suction path 20p. The suction portion 10e communicates with an end of the suction path 20p, and the other end of the suction path 20p communicates with a decompression device (not illustrated) (for example, an exhaust pump). The decompression device sucks out gas inside the cavity portion 10c through the suction path 20p (Step S20). Although the suction path 20p is provided in the second mold 20 in FIG. 2A, the suction path 20p may be provided in the first mold 10.

When the cavity portion 10c is depressurized, the resin material 40 is introduced (Step S30). The resin material 40 is introduced onto the plunger 32 through a pot portion 23 provided in the mold 10M. Although the pot portion 23 is provided in the second mold 20 in FIG. 2A, the pot portion 23 may be provided in the first mold 10.

At least a portion of the pot portion 23 is tubular, for example. The plunger 32 is arranged inside the pot portion 23. The resin material 40 is arranged at an end of the plunger 32. The transfer portion 31 can move up and down (along the Z-axis direction), for example. Moving of the transfer portion 31 causes the plunger 32 to move, so that the resin material 40 is fed to inside of the mold 10M (that is, the cavity portion 10c between the first mold 10 and the second mold 20).

For example, the resin material 40 is introduced into the cull portion 10u, while the first and second opening/closing portions 12a and 12b are in opened states. The resin material 40 after passing through the cull portion 10u passes through the runner portion 10r, and then arrives at the gate portion 10g. Thereafter, the resin material 40 is introduced into the cavity portion 10c.

Figure 5A:
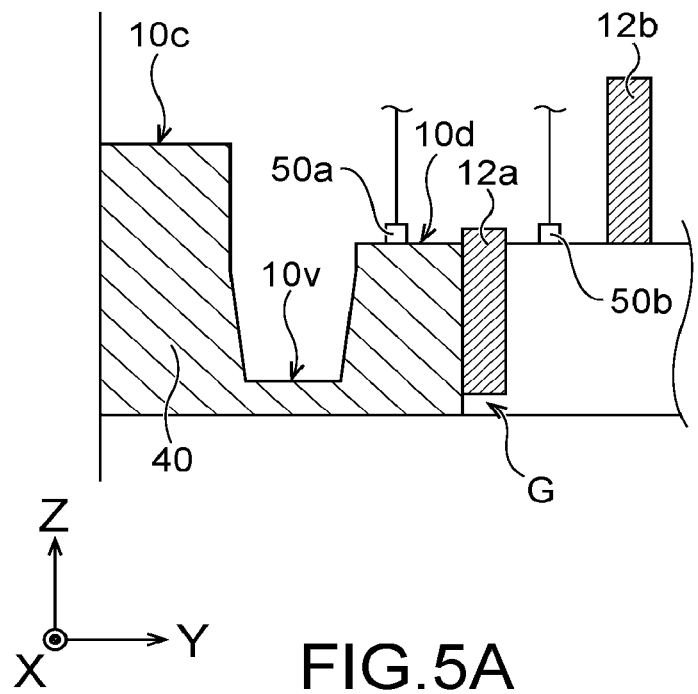
FIGS. 5A and 5B are cross-sectional views respectively illustrating a state in which a first sensor and a second sensor have detected a resin material.

Until the resin material 40 arrives at the intermediate cavity portion 10d, the first sensor 50a does not detect the resin material 40 and the first opening/closing portion 12a is in the opened state. (NO at Step S40). Meanwhile, when the resin material 40 passes through the vent portion 10v and arrives at the intermediate cavity portion 10d, the first sensor 50a detects the resin material 40 and outputs a detection signal to the controller 60 (YES at Step S40). The controller 60 controls the driver 12d to bring the first opening/closing portion 12a into a closed state, as illustrated in FIG. 5A (Step S50). FIG. 5A is a cross-sectional view illustrating a state in which the first sensor 50a has detected the resin material 40. The first opening/closing portion 12a reduces an opening diameter of the intermediate cavity portion 10d to narrow down the opening diameter. At this time, the first opening/closing portion 12a may bring the intermediate cavity portion 10d into a sealed state. However, the first opening/closing portion 12a may leave a gap G in the intermediate cavity portion 10d, as illustrated in FIG. 5A. An opening area of the gap G at this time is smaller than an opening area of the vent portion 10v. Due to this configuration, the resin material 40 in the cavity portion 10c can hardly pass through a discharge path, but gas can still pass through the gap G. Therefore, exhausting of air from the cavity portion 10c is continued, while flow of the resin material 40 is suppressed.

The first opening/closing portion 12a forms the gap G with the substrate to be processed 71 or the mold 20 in the Z-direction. However, the first opening/closing portion 12a may form a gap (not illustrated) with a sidewall of the intermediate cavity portion 10d of the mold 10 in the X-direction. In this case, it suffices that the width in the X-direction of the first opening/closing portion 12a is set to be smaller than the width in the X-direction of the intermediate cavity portion 10d. With this configuration, the gap is formed in a side portion in the X-direction of the first opening/closing portion 12a even if the first opening/closing portion 12a reaches the mold 20 when the first opening/closing portion 12a is brought into a closed state. Therefore, it is possible to allow gas to pass through the gap. Even with this configuration, it is possible to continue exhausting of air from the cavity portion 10c, while suppressing flow of the resin material 40.

Figure 5B:
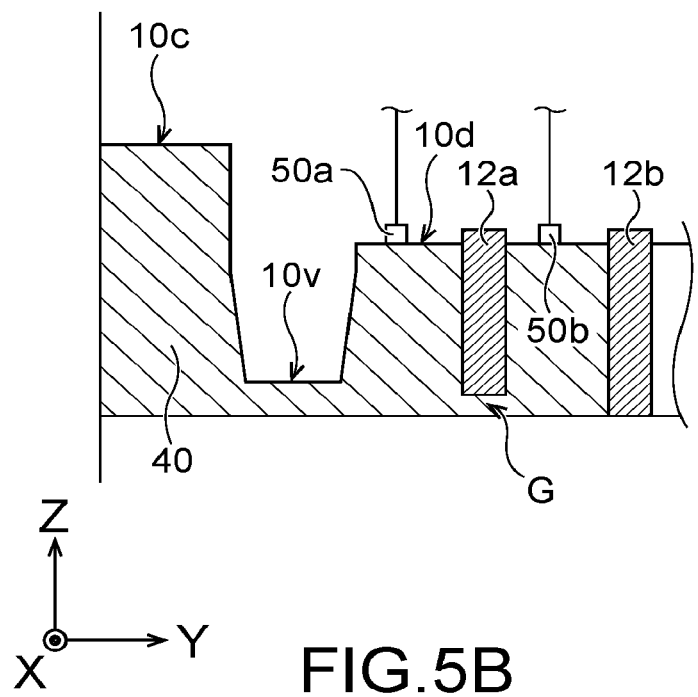

Subsequently, until the resin material 40 passes through the gap G, the second sensor 50b does not detect the resin material 40 and the second opening/closing portion 12b is in an opened state. (NO at Step S60). At this time, introduction of the resin material 40 is continued (Step S65). Meanwhile, when the resin material 40 passes through the gap G and arrives at the second sensor 50b, the second sensor 50b detects the resin material 40 and outputs a detection signal to the controller 60 (YES at Step S60). The controller 60 controls the driver 12d to bring the second opening/closing portion 12b into a closed state, as illustrated in FIG. 5B (Step S70). FIG. 5B is a cross-sectional view illustrating a state in which the second sensor 50b has detected the resin material 40. The second opening/closing portion 12b closes (shuts off) the opening of the intermediate cavity portion 10d. That is, the second opening/closing portion 12b brings a discharge path for gas into a substantially sealed state. In this manner, the resin material 40 in the cavity portion 10c is suppressed from flowing to the suction portion 10e and the suction path 20p.

Due to the second opening/closing portion 12b becoming a closed state, filling of the resin material 40 is ended.

Thereafter, a semiconductor package sealed by the resin material 40 is brought out from the mold 10M, and package processing of a next semiconductor chip is started. At this time, the first and second opening/closing portions 12a and 12b are brought back into opened states by the driver 12d and the like.

In the first embodiment, the sensors 50a and 50b are used as the first and second sensors. However, the sensors 50c and 50b may be used as the first and second sensors. In this case, when the first sensor 50c detects arrival of the position of the plunger 32 at a predetermined position at Step S40, the first opening/closing portion 12a is brought into a closed state. It suffices that an operation of the second sensor 50b is identical to the operation at Step S60 described above.

Further, the sensors 50c and 50a may be used as the first and second sensors. In this case, when the sensor 50c as the first sensor detects arrival of the position of the plunger 32 at a predetermined position at Step S40, the first opening/closing portion 12a is brought into a closed state. When the sensor 50a as the second sensor detects the resin material 40 at Step S60, the second opening/closing portion 12b is brought into a closed state.

Furthermore, the sensors 50a and 50c may be used as the first and second sensors. In this case, it suffices that an operation of the first sensor 50a is identical to the operation at Step S40 described above. The second sensor 50c brings the second opening/closing portion 12b to be in a closed state, when detecting arrival of the position of the plunger 32 at a predetermined position at Step S60.

In addition, in a case where only any one of the sensors 50a to 50c is provided, the first opening/closing portion 12a is brought into a closed state when the sensor (any of 50a to 50c) outputs a detection signal at Step S40. Thereafter, the second opening/closing portion 12b is brought into a closed state after a predetermined time passes after reception of a detection signal at Step S60.

As described above, the mold 10M according to the first embodiment includes the first and second opening/closing portions 12a and 12b provided between the vent portion 10v and the suction portion 10e. With this configuration, the first opening/closing portion 12a narrows down a discharge path for gas in the intermediate cavity portion 10d when the resin material 40 arrives at the intermediate cavity portion 10d. Therefore, it is possible to suppress flow of the resin material 40 to some extent, while maintaining discharge of gas in the cavity portion 10c. Further, the second opening/closing portion 12b cuts off (shuts off) the discharge path for gas in the intermediate cavity portion 10d when the resin material 40 arrives at a position between the first opening/closing portion 12a and the second opening/closing portion 12b. With this configuration, it is possible to suppress leak of the resin material 40 to the suction portion 10e and the suction path 20p. In this manner, the first and second opening/closing portions 12a and 12b dam the flow of the resin material 40 in two stages. Consequently, the mold 10 according to the first embodiment can suppress leak of resin through an exhaust hole more reliably, while sufficiently filling the resin in a cavity.

(Modification)

FIGS. 6A to 6F are plan views illustrating arrangements of the first and second opening/closing portions 12a and 12b. FIGS. 6A to 6F illustrate a downstream side of the cavity portion 10c, and illustration of an upstream side is omitted. The mold 10M can achieve effects of the above embodiment in any of planar layouts in FIGS. 6A to 6F.

Figure 6A:
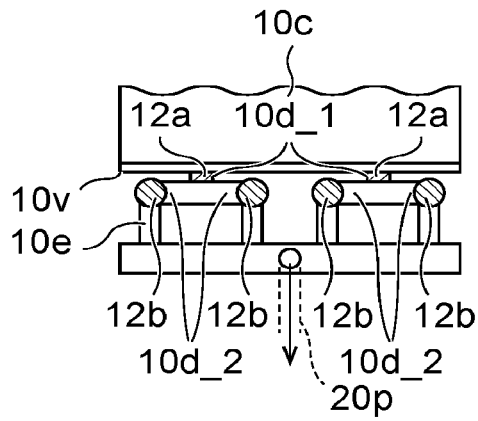
FIGS. 6A to 6F are plan views illustrating arrangements of first and second opening/closing portions.

In FIG. 6A, the intermediate cavity portion 10d branches into a plurality of sub-paths 10d_2 in the middle of a main path 10d_1. The first opening/closing portion 12a is provided in each main path 10d_1, and the second opening/closing portion 12b is provided in each sub-path 10d_2. Therefore, the first opening/closing portion 12a is provided in common to a plurality of second opening/closing portions 12b.

Figure 6B:
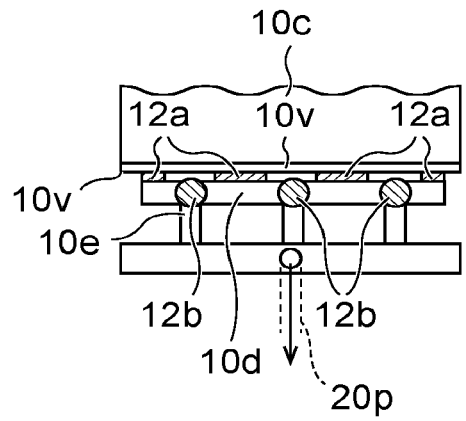

In FIG. 6B, the intermediate cavity portion 10d is configured as one common path that is common to a plurality of first opening/closing portions 12a and is common to a plurality of second opening/closing portions 12b. Therefore, all the first opening/closing portions 12a connected to the cavity portion 10c are connected to one intermediate cavity portion 10d, and all the second opening/closing portions 12b connected to the suction portion 10e are connected to the same intermediate cavity portion 10d.

Figure 6C:
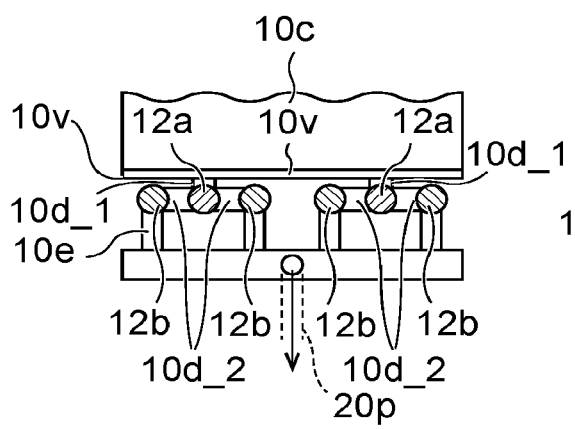

FIG. 6C is different from FIG. 6A in that the first opening/closing portion 12a is provided at a branching point between the main path 10d_1 and the sub-paths 10d_2. Other configurations of the mold 10 in FIG. 6C are identical to the configurations illustrated in FIG. 6A.

Figure 6D:
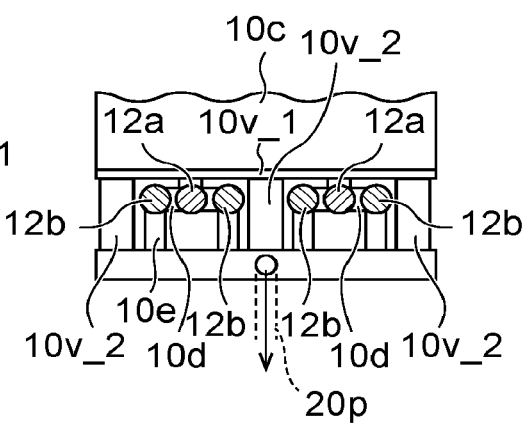

In FIG. 6D, a vent portion 10v_2 is added to the configuration in FIG. 6C. An opening/closing portion is not provided in the vent portion 10v_2. Therefore, the vent portion 10v2 functions as a bypass between the cavity portion 10c and the suction portion 10e. The vent portion 10v_2 can exhaust gas from inside the cavity portion 10c gradually. Meanwhile, the vent portion 10v_2 is narrower and longer in a direction in which the resin material 40 flows (the Y-direction) than the vent portion 10v_1. Therefore, the vent portion 10v_2 hardly allows the resin material 40 to pass therethrough.

Figure 6E:
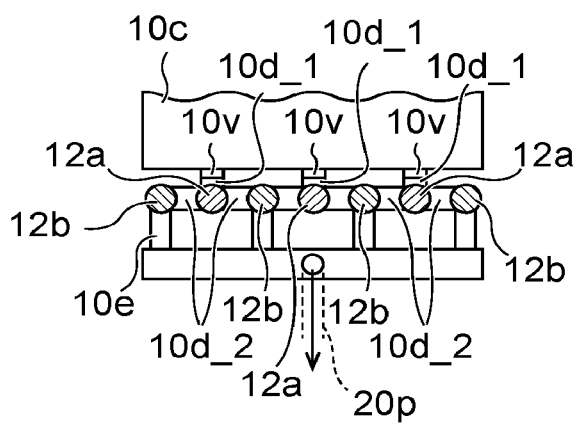

FIG. 6E is a combination of FIGS. 6B and 6C. Therefore, the intermediate cavity portion 10d is configured as one common path that is common to a plurality of first opening/closing portions 12a and is common to a plurality of second opening/closing portions 12b. Further, the first opening/closing portion 12a is provided at a branching point between the main path 10d_1 and the sub-paths 10d_2.

Figure 6F:
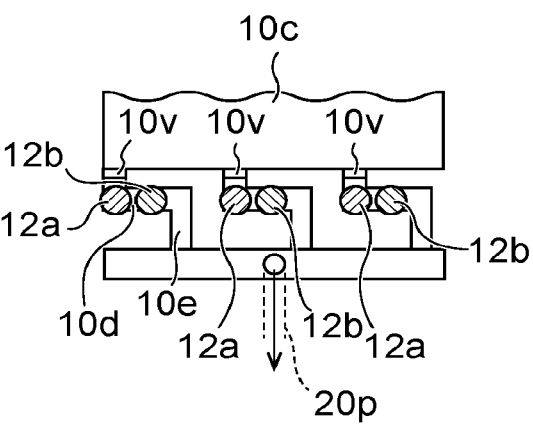

In FIG. 6F, a plurality of intermediate cavity portions 10d are connected between the cavity portion 10c and the suction portion 10e without branching. The first and second opening/closing portions 12a and 12b are provided to be continuous with each intermediate cavity portion 10d. FIG. 6F is similar to the planar layout in FIG. 1.

With any of the configurations in FIGS. 6A to 6F, the effects of the first embodiment are not lost. Also, a planar layout of a mold according to succeeding embodiments may be any of those illustrated in FIGS. 6A to 6F.

Second Embodiment

Figure 7A:
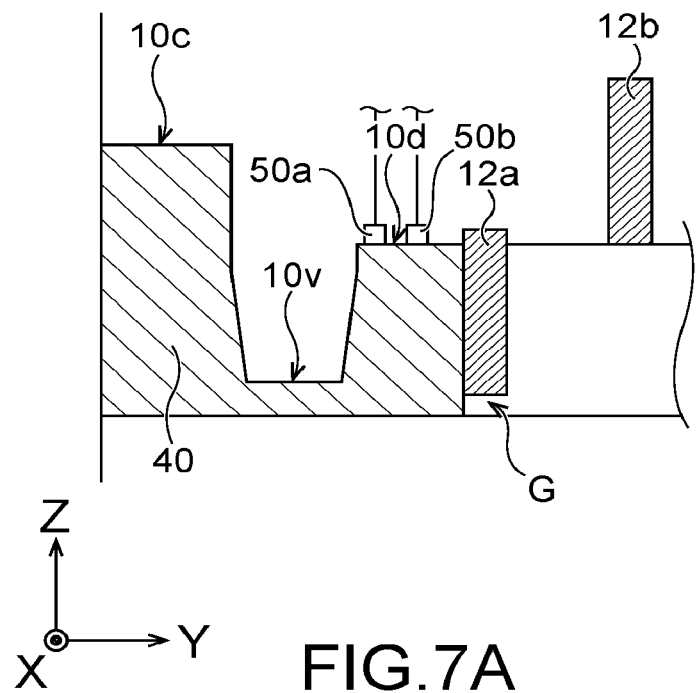
FIGS. 7A and 7B are partial cross-sectional views illustrating an example of a mold and a transfer molding device according to a second embodiment.
Figure 7B:
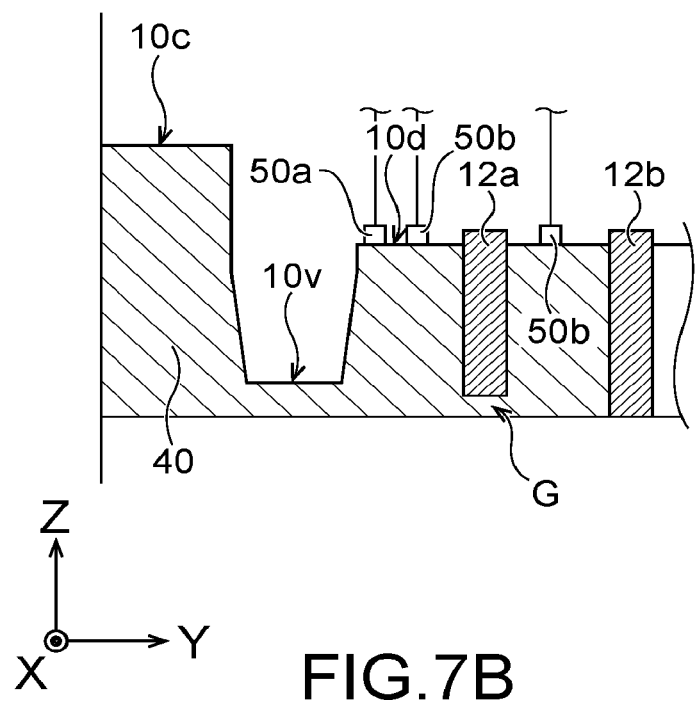

FIGS. 7A and 7B are partial cross-sectional views illustrating an example of a mold and a transfer molding device according to a second embodiment. FIGS. 7A and 7B illustrate a configuration of the mold 10 from the cavity portion 10c to the intermediate cavity portion 10d. The sensor 50b is arranged between the sensor 50a and the first opening/closing portion 12a in the second embodiment. The sensors 50a and 50b are arranged on the upstream side of the first opening/closing portion 12a to be continuous with each other. Other configurations of the second embodiment are identical to those according to the first embodiment.

Next, an operation of a molding device according to the second embodiment is described with reference to FIG. 4.

The sensors 50a and 50b are not particularly limited, but may be a photosensor and a pressure sensor, respectively, for example. In this case, until the resin material 40 arrives at the intermediate cavity portion 10d, the sensor 50a does not detect the resin material 40 and the first opening/closing portion 12a is in an opened state. (NO at Step S40 in FIG. 4). Meanwhile, when the resin material 40 passes through the vent portion 10v and arrives at the intermediate cavity portion 10d, the sensor 50a detects the resin material 40 and outputs a detection signal to the controller 60 (YES at Step S40 in FIG. 4). The controller 60 controls the driver 12d to bring the first opening/closing portion 12a into a closed state as illustrated in FIG. 7A (Step S50 in FIG. 4). Therefore, the first opening/closing portion 12a narrows down an opening diameter of the intermediate cavity portion 10d.

When the first opening/closing portion 12a is brought into a closed state, flow of the resin material 40 is restricted and therefore the pressure of the resin material 40 increases before the first opening/closing portion 12a. When the pressure of the resin material 40 is less than a threshold (NO at Step S60 in FIG. 4), the second sensor 50b does not detect the resin material 40 and the second opening/closing portion 12b is in an opened state. At this time, introduction of the resin material 40 is continued (Step S65 in FIG. 4). Meanwhile, when the pressure of the resin material 40 exceeds the threshold (YES at Step S60 in FIG. 4), the second sensor 50b detects the resin material 40 and outputs a detection signal to the controller 60. The controller 60 controls the driver 12d to bring the second opening/closing portion 12b into a closed state as illustrated in FIG. 7B (Step S70 in FIG. 4). At this time, the second opening/closing portion 12b cuts off a discharge path for gas in the intermediate cavity portion 10d in a substantially sealed state. Accordingly, the resin material 40 in the cavity portion 10c is suppressed from flowing to the suction portion 10e and the suction path 20p.

In this manner, the sensors 50a and 50b may be provided on the upstream side of the first opening/closing portion 12a. Even with this configuration, the second embodiment can achieve identical effects to those of the first embodiment.

The sensor 50c may be used in place of the sensor 50a. In this case, it suffices that the first opening/closing portion 12a is brought into a closed state when the position of the plunger 32 or the amount of the resin material 40 exceeds a threshold.

Third Embodiment

FIGS. 8A to 8D are partial cross-sectional views illustrating an example of a mold and a transfer molding device according to a third embodiment. The mold 10 according to the third embodiment is different from the mold 10 according to the second embodiment in further including a third opening/closing portion 12c and a sensor 50d. Other configurations of the third embodiment are identical to those according to the second embodiment.

Figure 8A:
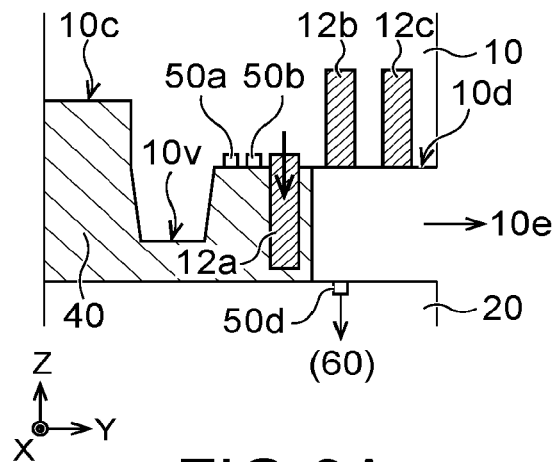
FIGS. 8A to 8D are partial cross-sectional views illustrating an example of a mold and a transfer molding device according to a third embodiment.
Figure 8B:
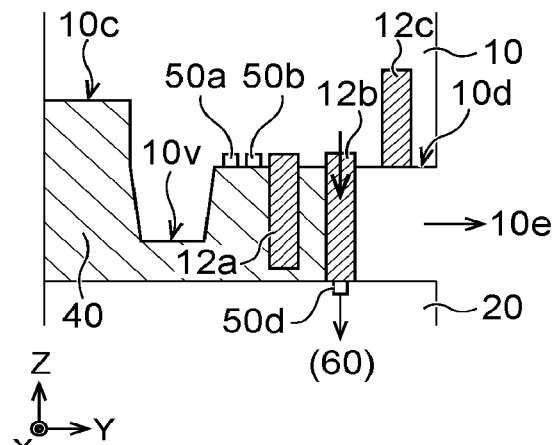

Configurations and operations of the sensors 50a and 50b and the first and second opening/closing portions 12a and 12b may be identical to those in the second embodiment. FIGS. 8A and 8B correspond to FIGS. 7A and 7B, respectively.

As illustrated in FIGS. 8A to 8D, the third opening/closing portion 12c is provided between the second opening/closing portion 12b and the suction portion 10e and opens and closes a discharge path in accordance with the operation of the second opening/closing portion 12b. The third opening/closing portion 12c may be driven by the driver 12d similarly to the first and second opening/closing portions 12a and 12b, or may be driven by another driving mechanism.

When the second opening/closing portion 12b has not operated, the third opening/closing portion 12c is brought into a closed state and cuts off a discharge path for gas in the intermediate cavity portion 10d in a substantially sealed state. In order to detect whether the second opening/closing portion 12b has operated normally, the sensor 50d is provided in the mold 20. The sensor 50d detects arrival of a tip of the second opening/closing portion 12b at a surface of the mold 20.

Figure 8C:
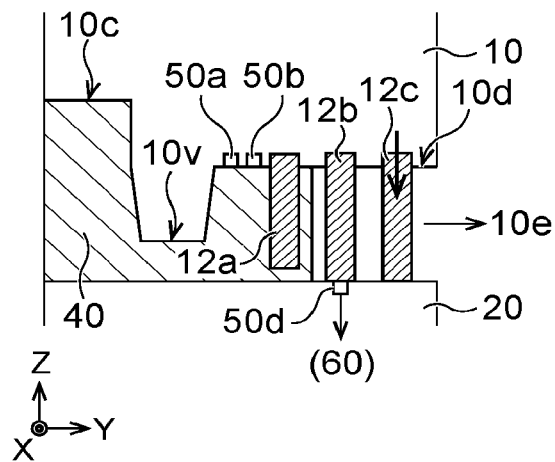
Figure 8D:
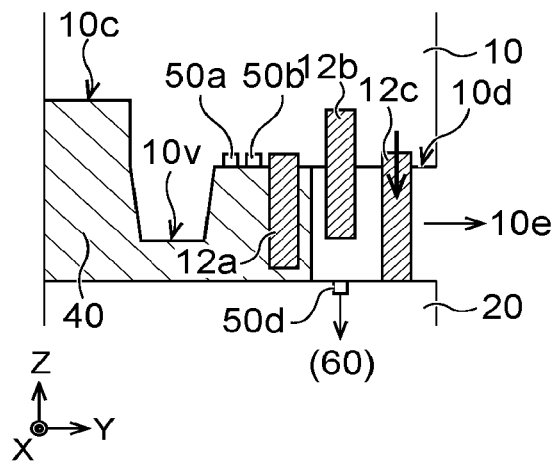

For example, the sensor 50d may be a photosensor using reflected light or a touch sensor using electromagnetic induction. The sensor 50d detects that the second opening/closing portion 12b is approaching the mold 20 or has come into contact with the mold 20. As illustrated in FIG. 8C, when the second opening/closing portion 12b has come into contact with the sensor 50d, the sensor 50d outputs a detection signal indicating the contact of the second opening/closing portion 12b, to the controller 60 based on the intensity of reflected light or an electromotive force. The controller 60 controls the driver 12d in accordance with the detection signal. The driver 12d may bring the third opening/closing portion 12c into a closed state or leave the third opening/closing portion 12c in an opened state, when detecting the detection signal. This is because the resin material 40 is shut off by the second opening/closing portion 12b because the second opening/closing portion 12b is in a closed state in this case. Meanwhile, when not detecting a detection signal, the driver 12d brings the third opening/closing portion 12c into a closed state, as illustrated in FIG. 8D. This is because there is a possibility that the second opening/closing portion 12b is not operating normally in this case and therefore the third opening/closing portion 12c has to shut off the resin material 40.

Figure 9:
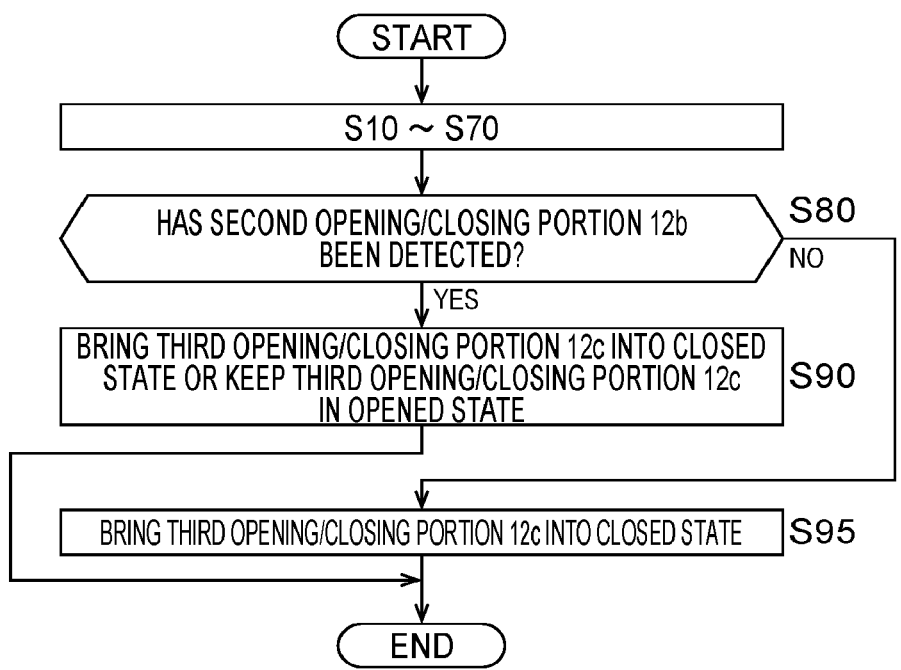
FIG. 9 is a flowchart illustrating an operation example of the transfer molding device according to the third embodiment.

FIG. 9 is a flowchart illustrating an operation example of the transfer molding device according to the third embodiment. The operation of the molding device according to the third embodiment is described with reference to FIGS. 8A to 9.

First, Steps S10 to S70 illustrated in FIG. 4 are performed. Immediately after detection of the resin material 40 by the sensor 50b at Step S70, the second opening/closing portion 12b is brought into a closed state, as illustrated in FIG. 8B. In a case where the second opening/closing portion 12b operates normally, the sensor 50d detects the second opening/closing portion 12b immediately after detection of the resin material 40 by the sensor 50b.

Therefore, in a case where the sensor 50d detects the second opening/closing portion 12b from reception of a detection signal from the sensor 50b until a predetermined time passes (YES at Step S80), the sensor 50d outputs a detection signal. The controller 60 includes a timer (not illustrated) and counts time from reception of the detection signal from the sensor 50b. The controller 60 then controls the driver 12d to bring the third opening/closing portion 12c into a closed state or to keep the third opening/closing portion 12c in an opened state (Step S90). In a case where the sensor 50d detects the second opening/closing portion 12b, the second opening/closing portion 12b is operating normally and therefore is in the closed state. Accordingly, the controller 60 may bring the third opening/closing portion 12c into a closed state or keep the third opening/closing portion 12c in an opened state. In FIG. 8C, the third opening/closing portion 12c is brought into a closed state.

In a case where the sensor 50d does not detect the second opening/closing portion 12b from reception of a detection signal from the sensor 50b until a predetermined time passes (NO at Step S80), the sensor 50d does not output a detection signal from reception of the detection signal from the sensor 50b until the predetermined time passes. In this case, it is highly likely that the second opening/closing portion 12b is not operating normally. Therefore, the controller 60 controls the driver 12d to bring the third opening/closing portion 12c into a closed state, as illustrated in FIG. 8D (Step S95).

In this manner, according to the third embodiment, the mold 10 further includes the third opening/closing portion 12c, and a discharge path is shut off when the second opening/closing portion 12b does not operate normally. With this configuration, it is possible to suppress the resin material 40 from leaking to a downstream side of the suction portion 10e even when the second opening/closing portion 12b does not operate normally. Further, the third embodiment can achieve identical effects to those of the first embodiment.

Further, the sensor 50c in FIG. 2A may be used in place of the sensor 50a. In this case, it suffices that the first opening/closing portion 12a is brought into a closed state when the position of the plunger 32 or the amount of the resin material 40 exceeds a threshold.

Fourth Embodiment

FIGS. 10A to 10E are partial cross-sectional views illustrating an example of a mold and a transfer molding device according to a fourth embodiment. The operation flow of the molding device can be identical to that illustrated in FIG. 9.

Figure 10A:
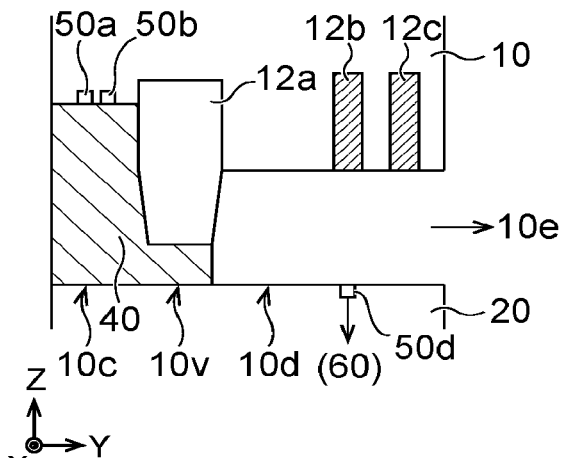
FIGS. 10A to 10E are partial cross-sectional views illustrating an example of a mold and a transfer molding device according to a fourth embodiment.

According to the fourth embodiment, the vent portion 10v of the mold 10 is operable in the Z-direction and an opposite direction thereto. The vent portion 10v functions as the first opening/closing portion 12a. For example, until the position of the plunger 32 arrives at a predetermined position or the sensor 50a detects the resin material 40, the first opening/closing portion 12a (that is, the vent portion 10v of the mold 10) is in a largely opened state, as illustrated in FIG. 10A. This configuration enables gas in the cavity portion 10c to easily pass through the vent portion 10v.

Figure 10B:
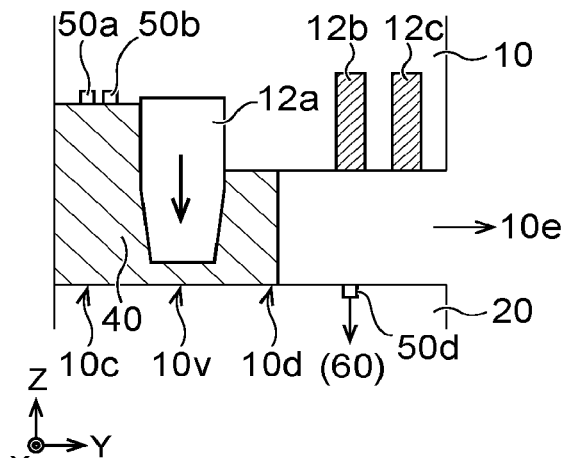

When the sensor 50c detects arrival of the position of the plunger 32 at the predetermined position or the sensor 50a detects the resin material 40, the first opening/closing portion 12a (that is, the vent portion 10v of the mold 10) is brought into a closed state, as illustrated in FIG. 10B. Therefore, a gap in the vent portion 10v is narrowed down, so that it is possible to maintain exhausting of air from the cavity portion 10c while suppressing flow of the resin material 40.

Figure 10C:
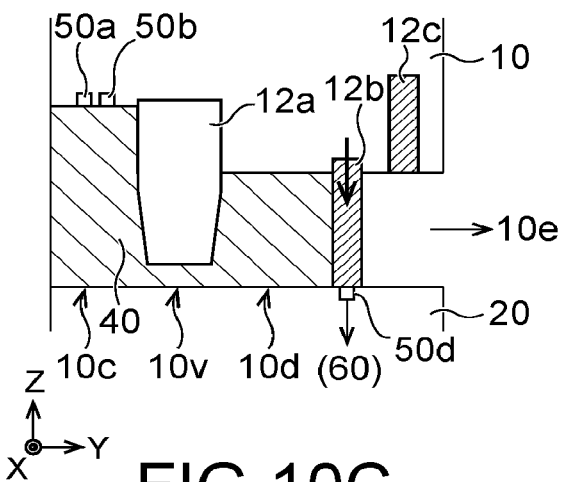
Figure 10D:
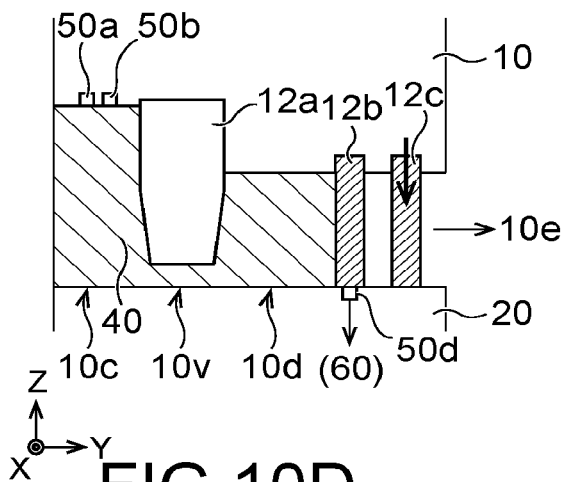

Thereafter, it suffices that operations of the second and third opening/closing portions 12b and 12c are identical to those in the third embodiment. That is, the second opening/closing portion 12b is brought into a closed state when the sensor 50b detects the resin material 40, as illustrated in FIG. 10C. At this time, in a case where the sensor 50d detects the second opening/closing portion 12b from reception of a detection signal from the sensor 50b until a predetermined time passes (YES at S80 in FIG. 9), the controller 60 brings the third opening/closing portion 12c into a closed state or keeps it in an opened state, as illustrated in FIG. 10D (Step S90). In FIG. 10D, the third opening/closing portion 12c is brought into a closed state.

Figure 10E:
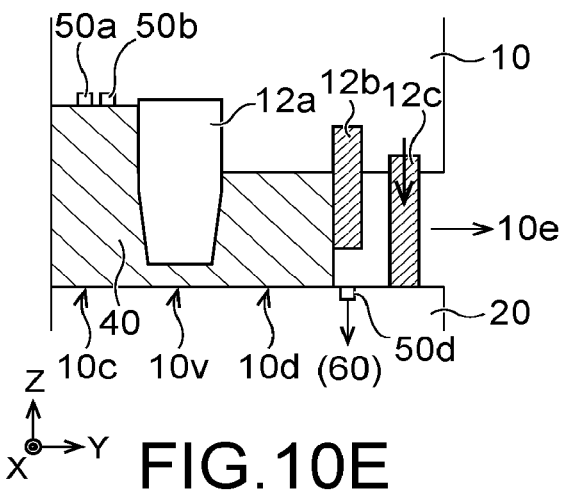

In a case where the sensor 50d does not detect the second opening/closing portion 12b from reception of a detection signal from the sensor 50b until the predetermined time passes (NO at Step S80 in FIG. 9), the sensor 50d does not output a detection signal from reception of the detection signal from the sensor 50b until the predetermined time passes. This case means that the second opening/closing portion 12b has not operated normally. Therefore, the controller 60 controls the driver 12d to bring the third opening/closing portion 12c into a closed state, as illustrated in FIG. 10E (Step S95 in FIG. 9). Accordingly, the third opening/closing portion 12c cuts off a discharge path in the intermediate cavity portion 10d, in place of the second opening/closing portion 12b.

In this manner, the vent portion 10v of the mold 10 may be configured to be movable and be used as the first opening/closing portion 12a. Even with this configuration, the third opening/closing portion 12c can shut off a discharge path in a case where the second opening/closing portion 12b does not operate normally. Therefore, the fourth embodiment can obtain identical effects as those according to the third embodiment.

First Modification

In the fourth embodiment, the first opening/closing portion 12a (that is, the movable vent portion 10v) narrows down a discharge path only once. However, the first opening/closing portion 12a may narrow down the discharge path multiple times in a stepwise manner.

FIGS. 11A to 11D are partial cross-sectional views illustrating an example of a mold and a transfer molding device according to a first modification. It is assumed that the sensor 50a is a photosensor and the sensor 50b is a pressure sensor, for example.

Figure 11A:
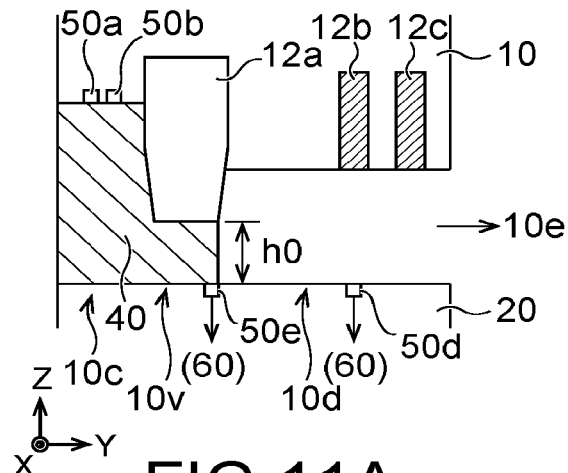
FIGS. 11A to 11D are partial cross-sectional views illustrating an example of a mold and a transfer molding device according to a first modification.

As illustrated in FIG. 11A, the first opening/closing portion 12a is in a largely opened state until the sensor 50a detects the resin material 40. This configuration enables gas in the cavity portion 10c to easily pass through the vent portion 10v. The height of the first opening/closing portion 12a from a surface of the mold 20 is assumed to be h0.

Figure 11B:
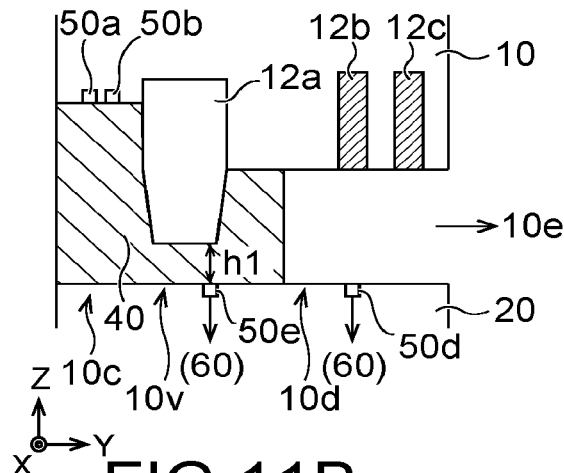

Subsequently, when the sensor 50a detects the resin material 40, the first opening/closing portion 12a narrows down a discharge path to a first height h1 (h1<h0), as illustrated in FIG. 11B. Therefore, damming of the resin material 40 is started, while exhausting of air in the cavity portion 10c is continued. Accordingly, the pressure of the resin material 40 in the cavity portion 10c gradually increases.

Figure 11C:
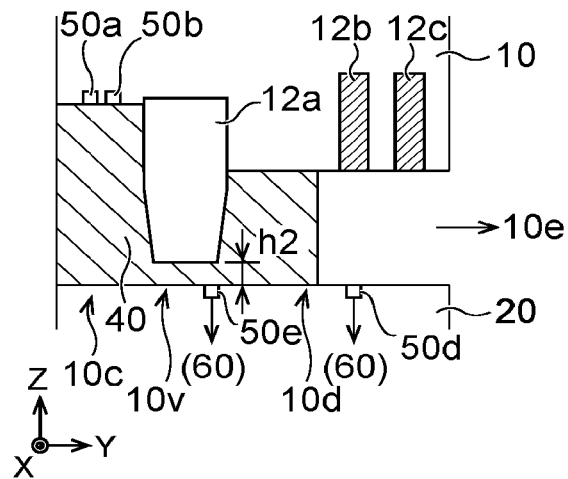

Subsequently, when the sensor 50b detects the pressure of the resin material 40 and the pressure reaches a first pressure, the first opening/closing portion 12a narrows down the discharge path to a second height h2 lower than the first height h1 (h1<h2), as illustrated in FIG. 11C. Therefore, an effect of damming the resin material 40 is enhanced, while exhausting of air in the cavity portion 10c is further continued. Accordingly, the pressure of the resin material 40 in the cavity portion 10c further increases.

Figure 11D:
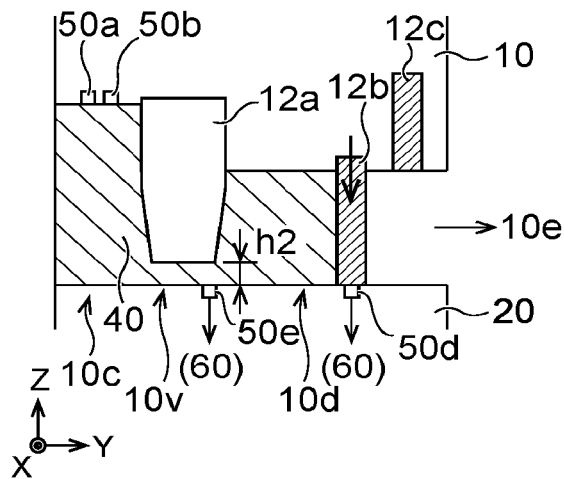

Thereafter, when the pressure of the resin material 40 reaches a second pressure higher than the first pressure, the second opening/closing portion 12b is brought into a closed state, as illustrated in FIG. 11D. Therefore, the discharge path is cut off, and introduction of the resin material 40 is ended. It suffices that operations of the second and third opening/closing portions 12b and 12c are identical to those described with reference to FIGS. 10D and 10E.

The operation of the first opening/closing portion 12a is controlled based on the pressure of the resin material 40 in the first modification. However, the operation of the first opening/closing portion 12a may be controlled based on the position of the plunger 32 by using the sensor 50c. In this case, when the position of the plunger 32 reaches a first position, the first opening/closing portion 12a narrows down the discharge path to the first height. When the position of the plunger 32 reaches a second position ahead of the first position, the first opening/closing portion 12a narrows down the discharge path to the second height. Thereafter, when the position of the plunger 32 reaches a third position ahead of the second position, the second opening/closing portion 12b is brought into a closed state. Therefore, the discharge path is cut off and introduction of the resin material 40 is ended.

Further, the operation of the first opening/closing portion 12a may be controlled based on both the pressure of the resin material 40 and the position of the plunger 32.

Furthermore, the first opening/closing portion 12a is controlled to three different heights in the first modification. However, the number of the heights is not limited thereto. The first opening/closing portion 12a may be controlled to four or more different heights.

Second Modification

Operations in a second modification are identical to those in the fourth embodiment, in a case where the first opening/closing portion 12a has operated normally. Meanwhile, in a case where the first opening/closing portion 12a has not operated normally, the second opening/closing portion 12b is brought into a closed state immediately. In this case, the mold is provided with a sensor 50e directly below the first opening/closing portion 12a, as illustrated in FIGS. 11A to 11D. The sensor 50e is a solenoid, for example, and detects the position of the first opening/closing portion 12a based on an induced electromotive force caused by approach of the first opening/closing portion 12a. In this manner, the sensor 50e detects whether the first opening/closing portion 12a has operated normally.

Figure 12:
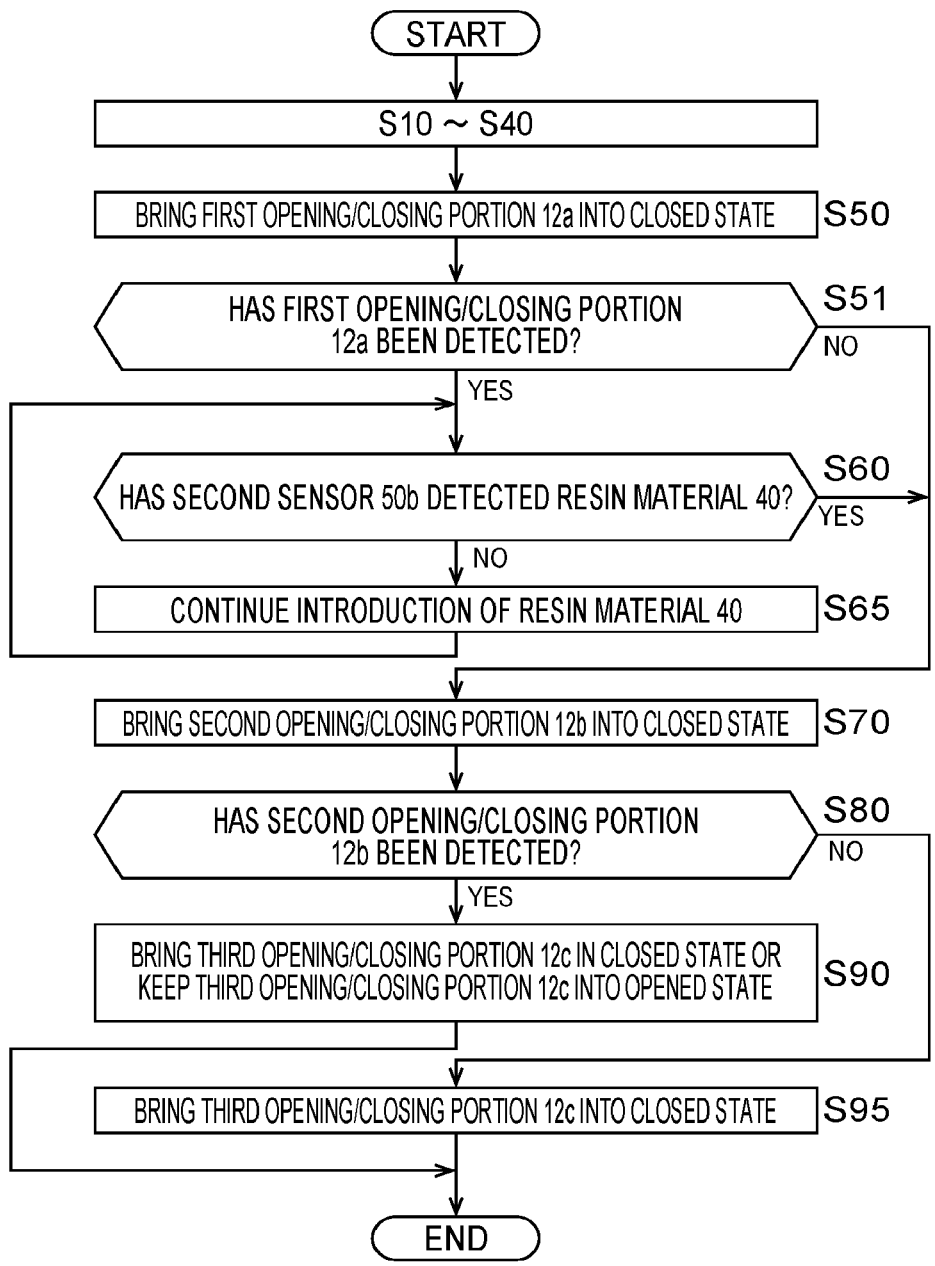
FIG. 12 is a flowchart illustrating an operation example of a transfer molding device according to a second modification of the fourth embodiment.

FIG. 12 is a flowchart illustrating an operation example of a transfer molding device according to the second modification of the fourth embodiment. After Steps S10 to S40 are performed, the first opening/closing portion 12a is brought into a closed state in a case of YES at Step S40 (Step S50). At this time, in a case where the sensor 50e detects the first opening/closing portion 12a from reception of a detection signal from the sensor 50a until a predetermined time passes (YES at Step S51), the controller 60 performs Steps S60 to S95 illustrated in FIG. 4.

In a case where the sensor 50e does not detect the first opening/closing portion 12a from reception of a detection signal from the sensor 50a until a predetermined time passes (NO at Step S51), the sensor 50e does not output a detection signal from reception of a detection signal of the sensor 50a until a predetermined time passes. Therefore, the controller 60 brings the second opening/closing portion 12b into a closed state without waiting for detection of the resin material 40 by the sensor 50b (Step S70). Thereafter, it suffices that Steps S80 to S95 are performed.

As described above, in a case where the first opening/closing portion 12a has not operated normally, the second opening/closing portion 12b may be brought into a closed state immediately. By doing this operation, it is possible to suppress entry of the resin material 40 into the suction portion 10e more reliably.

Fifth Embodiment

Figure 13:
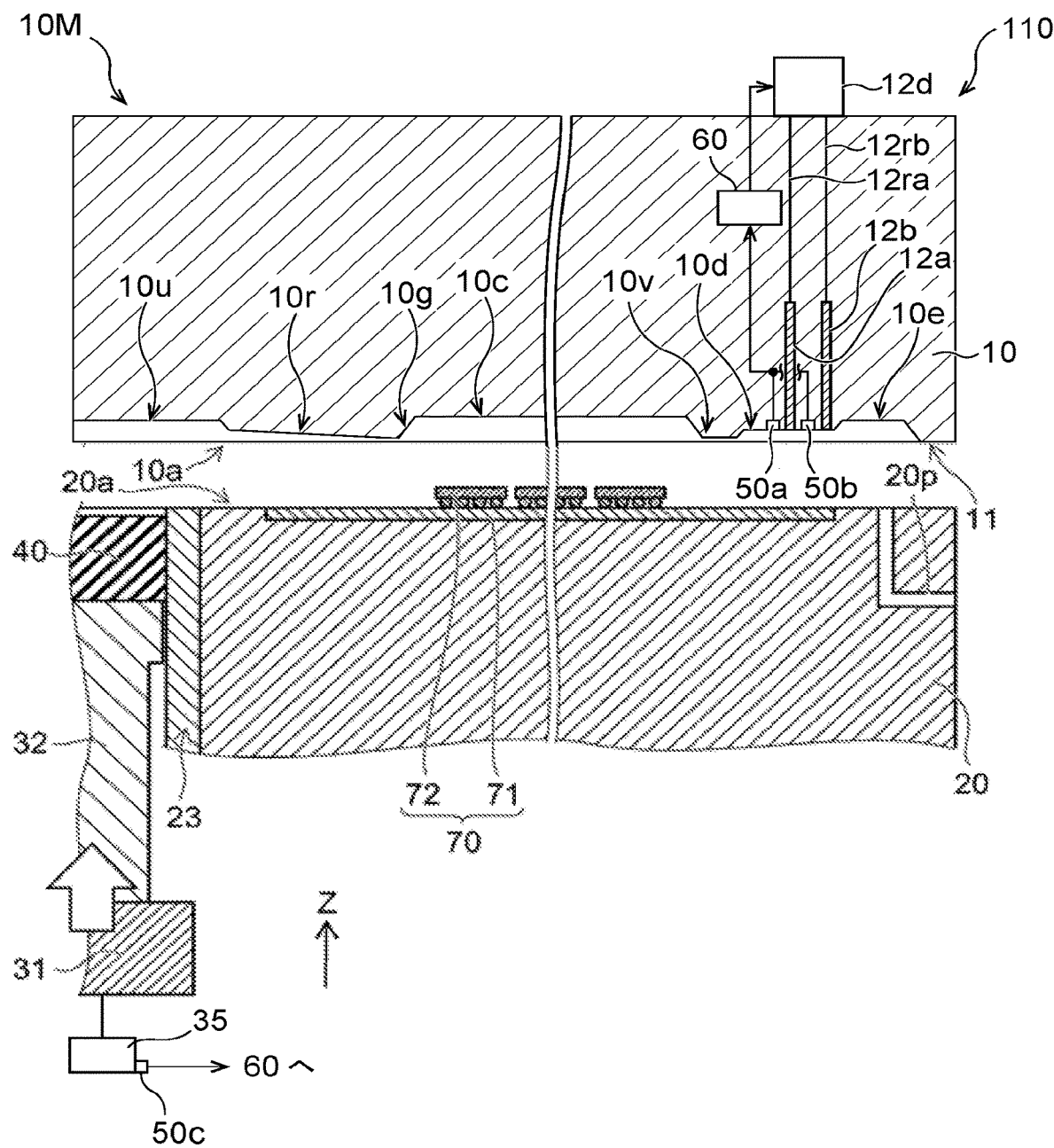
FIG. 13 is a plan view illustrating an example of a mold according to a fifth embodiment.

FIG. 13 is a plan view illustrating an example of a mold according to a fifth embodiment.

In a case where the driver 12d is an air cylinder, for example, the driver 12d can be incorporated into the mold 10. However, in many cases, a space in the mold 10 in which the air cylinder is incorporated is small, and it is difficult to ensure an air flow path from outside of the mold 10 to the air cylinder. Therefore, in some cases, it is difficult to provide an individual air cylinder for every discharge path, and therefore the air cylinder has to be provided for each of the plurality of discharge paths.

On the other hand, the mold 10 according to the fifth embodiment further includes rods 12ra and 12rb that are connected to the first and second opening/closing portions 12a and 12b and extend upward of the mold 10. The driver 12d drives the first and second opening/closing portions 12a and 12b via the rods 12ra and 12rb. In this case, the driver 12d can be attached on an outer wall of the mold 10, and therefore may be an actuator that is not so high in heat resisting property. For example, the driver 12d may be a servo motor or a solenoid. A servo motor, a linear motor, or a solenoid can operate at a higher speed as compared with an air cylinder, and can control the first and second opening/closing portions 12a and 12b in a stepwise manner.

Further, the driver 12d is arranged outside the mold 10, and the rods 12ra and 12rb are provided for the first and second opening/closing portions 12a and 12b, respectively, of each discharge path. This configuration enables the driver 12d to control the first and second opening/closing portions 12a and 12b individually for each discharge path.

It is also possible to easily return (raise) the first and second opening/closing portions 12a and 12b in the Z-direction by causing a reverse current to flow in the servo motor, the linear motor, or the solenoid as the driver 12d to cause the servo motor, the linear motor, or the solenoid to operate in an opposite direction.

For example, when a rod is connected to the first opening/closing portion 12a (the movable vent portion 10v) in FIGS. 10A to 10E, the driver 12d can control the first opening/closing portion 12a at a high speed in a stepwise manner in accordance with the fourth embodiment.

The fifth embodiment can be applied to any one of the above or following embodiments.

Sixth Embodiment

The transfer molding device is described in the above embodiments. Meanwhile, a sixth embodiment is an example of application of the first and second opening/closing portions 12a and 12b to a compression molding device.

Figure 14A:
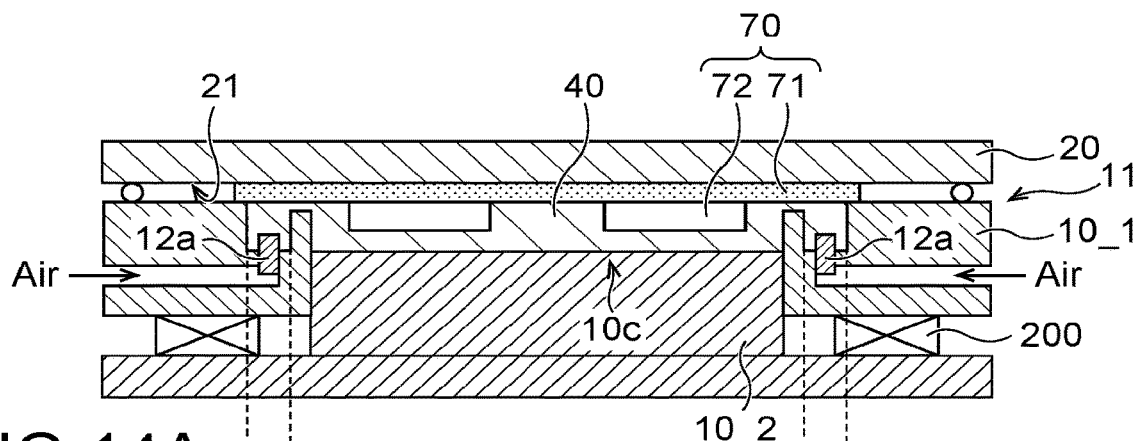
FIGS. 14A and 14B are a cross-sectional view and a plan view illustrating a configuration example of a mold and a compression molding device according to a sixth embodiment.
Figure 14B:
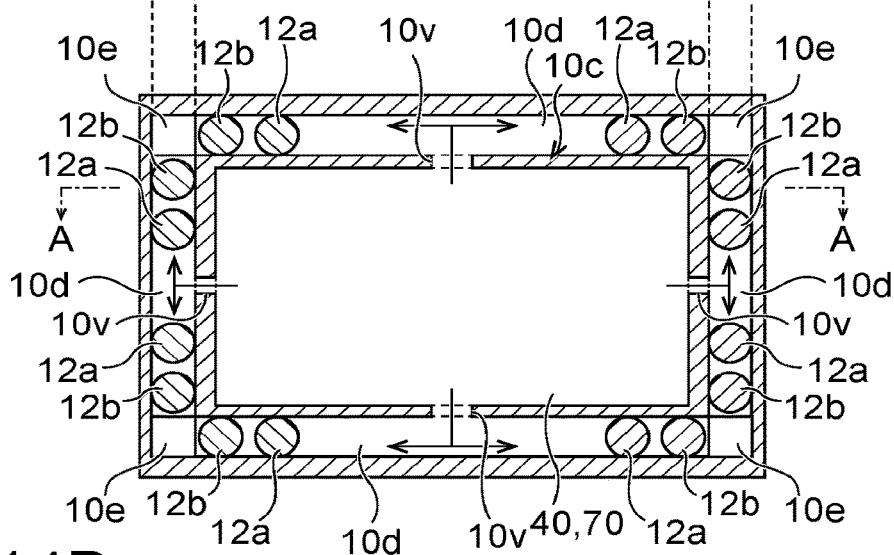

FIGS. 14A and 14B are a cross-sectional view and a plan view illustrating a configuration example of a mold and a compression molding device according to the sixth embodiment. FIG. 14A is a cross-sectional view, taken along a line A-A in FIG. 14B.

As illustrated in FIG. 14B, first molds 10_1 and 10_2 include the cavity portion 10c, the vent portion 10v, the intermediate cavity (dummy cavity) portion 10d, and the suction portion 10e, as concave portions. Each of the concave portions is a region that recedes from a flat portion (the substrate clamping surface 11) of the first molds 10_1 and 10_2. The concave portions communicate with each other in such a manner that the resin material 40 and air can pass therethrough, when the first molds 10_1 and 10_2 and the second mold 20 are closed. A relation of the distances (depths) from the substrate clamping surface 11 among the cavity portion 10c, the vent portion 10v, and the intermediate cavity portion 10d may be identical to that in the first embodiment.

As illustrated in FIG. 14B, the intermediate cavity portion 10d is provided in each of four sides of the cavity portion 10c. The vent portion 10v is provided between each of the intermediate cavity portions 10d in the four sides of the cavity portion 10c and the cavity portion 10c, and makes them communicate with each other. The suction portion 10e is provided at each of four corners of the cavity portion 10c, and communicates with the cavity portion 10c via the intermediate cavity portion 10d and the vent portion 10v. In this manner, the vent portions 10v and the intermediate cavity portions 10d configure a discharge path, when the first molds 10_1 and 10_2 and the second mold 20 are closed.

Further, the first molds 10_1 and 10_2 are provided with the first opening/closing portion 12a and the second opening/closing portion 12b. The arrangements and the configurations of the first and second opening/closing portions 12a and 12b may be identical to those in the first embodiment. Therefore, the first opening/closing portion 12a is provided in the intermediate cavity portion 10d between the vent portion 10v and the suction portion 10e, and opens and closes a discharge path for air in the cavity portion 10c. The second opening/closing portion 12b is provided between the first opening/closing portion 12a and the suction portion 10e, and opens and closes the above discharge path. In this manner, the first and second opening/closing portions 12a and 12b can suppress the resin material 40 from leaking to the suction portion 10e without hindering exhausting of air inside the cavity portion 10c. Each of the first and second opening/closing portions 12a and 12b may be a shut-off pin driven by an air cylinder, as illustrated in FIG. 14A.

Although not illustrated, the sensors 50a to 50c are provided in the first molds 10_1 and 10_2. The configurations and the arrangements of the sensors 50a to 50c may be also identical to those in the first embodiment.

Meanwhile, a bottom surface 21 of the second mold 20 is flat, and the object to be processed 70 is attached thereon.

In a molding operation, the resin material 40 that is melted is fed to concave portions of the first molds 10_1 and 10_2 in advance, and the first and second molds 10_1 and 10_2 and 20 are closed, so that the object to be processed 70 on the second mold 20 is pressed against the resin material 40, as illustrated in FIG. 14A. At this time, the mold 10_1 is elastically pressed against the second mold 20 because of an elastic body 200. In this manner, a semiconductor device is formed by compression molding.

At the time of molding, gas in the cavity portion 10c passes through the vent portion 10v and the intermediate cavity portion 10d, and is discharged from the suction portion 10e, as illustrated in FIG. 14B. At this time, the first and second opening/closing portions 12a and 12b suppress the resin material 40 from leaking to the suction portion 10e or the suction path 20p. It suffices that operations of the first and second opening/closing portions 12a and 12b and operations of the sensors 50a to 50c are identical to those in the first embodiment. In this manner, the sixth embodiment can be also applied to a compression molding device.

Further, the intermediate cavity portions 10d are arranged in a surrounding portion of the cavity portion 10c in the sixth embodiment. Therefore, the distance of the discharge path from the vent portion 10v to the suction portion 10e becomes long. Accordingly, it is possible to make a time period during which the resin material 40 flows in the intermediate cavity portion 10d long. Accordingly, a time period for reducing the pressure in the cavity portion 10c becomes long, so that exhausting of air in the cavity portion 10c can be sufficiently performed.

In a case where the discharge path is short, the resin material 40 reaches the suction portion 10e in a short time. In this case, gas inside the cavity portion 10c is not sufficiently discharged, and therefore the degree of vacuum inside the cavity portion 10c is degraded during compression.

On the other hand, the time period for reducing the pressure in the cavity portion 10c is long in the sixth embodiment. Therefore, it is possible to sufficiently exhaust the air in the cavity portion 10c even when compression is performed.

A discharge path formed by the vent portion 10v and the intermediate cavity portion 10d may be provided in opposing two sides of the cavity portion 10c only. Also in this case, effects of the sixth embodiment are not lost.

Further, the compression molding device according to the sixth embodiment may further include the third opening/closing portion 12c, the sensor 50d, and the sensor 50e. Therefore, the sixth embodiment can be also combined with any of the first to fifth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A mold comprising:
   a first surface to be in contact with a surface of a substrate to be processed;
   a cavity portion that recedes in a first direction in which the cavity portion is away from the first surface, a resin material being introduced into the cavity portion;
   a vent portion that recedes in the first direction and that is closer to the first surface than the cavity portion, the vent portion that communicates with the cavity portion and that serves as a discharge path for gas inside the cavity portion;
   a suction portion that recedes in the first direction and that is farther from the first surface than the vent portion, the suction portion communicating with the vent portion;
   a first shut-off pin provided between the vent portion and the suction portion to open and partially close the discharge path so as to suppress the resin material;
   a plurality of second shut-off pins provided between the first shut-off pin and the suction portion to open and close the discharge path so as not to pass the resin material through the discharge path; and
   a first sensor to detect at least one of first parameters including a temperature of the mold, a pressure of the resin material, intensity of reflected light or intensity of transmitted light of the discharge path, and a time after the first shut-off pin is brought into a partially closed state;
   wherein the first shut-off pin brings the discharge path into a partially closed state based on at least one of the first parameters;
   wherein the plurality of second shut-off pins brings the discharge path into a closed state based on at least one of the first parameters, and
   wherein the discharge path from the vent portion to the suction portion branches into a plurality of sub-paths, the first shut-off pin is provided at a branching point of the sub-paths, and the plurality of second shut-off pins are respectively provided for the respective sub-paths.

2. The mold of claim 1, wherein the first shut-off pin is common to a plurality of the second shut-off pins.

3. The mold of claim 1, further comprising a third shut-off pin provided between one of the plurality of second shut-off pins and the suction portion to open and close the discharge path in response to an operation of the second shut-off pin.

4. The mold of claim 1, wherein the first sensor is provided between the first shut-off pin and the vent portion.

5. The mold of claim 1, wherein the first sensor is provided between the first shut-off pin and the vent portion.

6. The mold of claim 1, further comprising a second sensor provided between the first shut-off pin and the first sensor.

7. The mold of claim 1, wherein the further comprising a second sensor provided between the first shut-off pin and one of the plurality of second shut-off pins.

8. A mold comprising:
a first surface to be in contact with a surface of a substrate to be processed;
a cavity portion that recedes in a first direction in which the cavity portion is away from the first surface, a resin material being introduced into the cavity portion;
a vent portion that recedes in the first direction and that is closer to the first surface than the cavity portion, the vent portion that communicates with the cavity portion and that serves as a plurality of discharge path for gas inside the cavity portion;
a suction portion that recedes in the first direction and that is farther from the first surface than the vent portion, the suction portion communicating with the vent portion;
a first shut-off pin provided between the vent portion and the suction portion to open and partially close the discharge path so as to suppress the resin material, but not to completely close the discharge path of the resin material;
a second shut-off pin provided between the first shut-off pin and the suction portion to open and close the discharge path so as not to pass the resin material through the discharge path; and
a first sensor to detect at least one of first parameters including a temperature of the mold, a pressure of the resin material, intensity of reflected light or intensity of transmitted light of the discharge path, and a time after the first shut-off pin is brought into a partially closed state; and
a second sensor to detect at least one of second parameters including a temperature of the mold, a pressure of the resin material, intensity of reflected light or intensity of transmitted light of the discharge path and a time after the first shut-off pin is brought into a partially closed state, wherein
the first shut-off pin brings the discharge path into a partially closed state based on at least one of the first parameters, and
the second shut-off pin brings the discharge path into a closed state based on at least one of the second parameters.

* * * * *